United States Patent
Watanabe

(10) Patent No.: US 8,921,224 B2
(45) Date of Patent: Dec. 30, 2014

(54) SEMICONDUCTOR DEVICE HAVING THROUGH ELECTRODE AND METHOD FOR MANUFACTURING THE SAME

(71) Applicant: Kabushiki Kaisha Toshiba, Minato-ku, Tokyo (JP)

(72) Inventor: Shinya Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/757,178

(22) Filed: Feb. 1, 2013

(65) Prior Publication Data

US 2014/0015139 A1    Jan. 16, 2014

(30) Foreign Application Priority Data

Jul. 12, 2012   (JP) ................. 2012-156561

(51) Int. Cl.
- *H01L 23/58* (2006.01)
- *H01L 23/495* (2006.01)
- *H01L 21/768* (2006.01)
- *H01L 23/48* (2006.01)
- *H01L 23/538* (2006.01)

(52) U.S. Cl.
CPC ....... *H01L 23/538* (2013.01); *H01L 2224/0557* (2013.01); *H01L 21/76898* (2013.01); *H01L 2224/05* (2013.01); *H01L 23/481* (2013.01); *H01L 2224/13023* (2013.01); *H01L 2224/13* (2013.01)
USPC ............................ 438/637; 438/667; 438/672

(58) Field of Classification Search
USPC ......... 438/637, 618, 666, 629, 640, 667, 668, 438/672; 257/758
See application file for complete search history.

(56) References Cited

U.S. PATENT DOCUMENTS

| | | | |
|---|---|---|---|
| 6,023,041 A * | 2/2000 | Noddin .................... | 219/121.71 |
| 2002/0031650 A1 * | 3/2002 | Fischer et al. ............... | 428/209 |
| 2009/0181494 A1 * | 7/2009 | Kim et al. .................... | 438/107 |
| 2010/0327383 A1 | 12/2010 | Hayasaki et al. | |

FOREIGN PATENT DOCUMENTS

| | | | |
|---|---|---|---|
| JP | 2004-152967 A | 5/2004 |
| JP | 2006-210485 A | 8/2006 |
| JP | 2008-210952 A | 9/2008 |
| JP | 2011-003645 A | 1/2011 |
| JP | 2011-009645 A | 1/2011 |

* cited by examiner

*Primary Examiner* — Matthew Reames
*Assistant Examiner* — Dilinh Nguyen
(74) *Attorney, Agent, or Firm* — Holtz, Holtz, Goodman & Chick PC

(57) ABSTRACT

According to one embodiment, a method for manufacturing a semiconductor device, includes: forming, on a first surface of a semiconductor substrate containing silicon, a ring-like insulating film having a ring-like shape; laminating a first insulating film, a first silicon film and a first metal film on the first surface and the ring-like insulating film; forming an opening which passes through the semiconductor substrate, the first insulating film and the first silicon film from a second surface of the semiconductor substrate by use of the first metal film as a stopper, as well as passing through the inside of the ring of the ring-like insulating film, to reach the surface of the first metal film; forming a second insulating film so as to cover an inner wall of the opening; and embedding a second metal film into the opening, to form a through electrode.

8 Claims, 22 Drawing Sheets

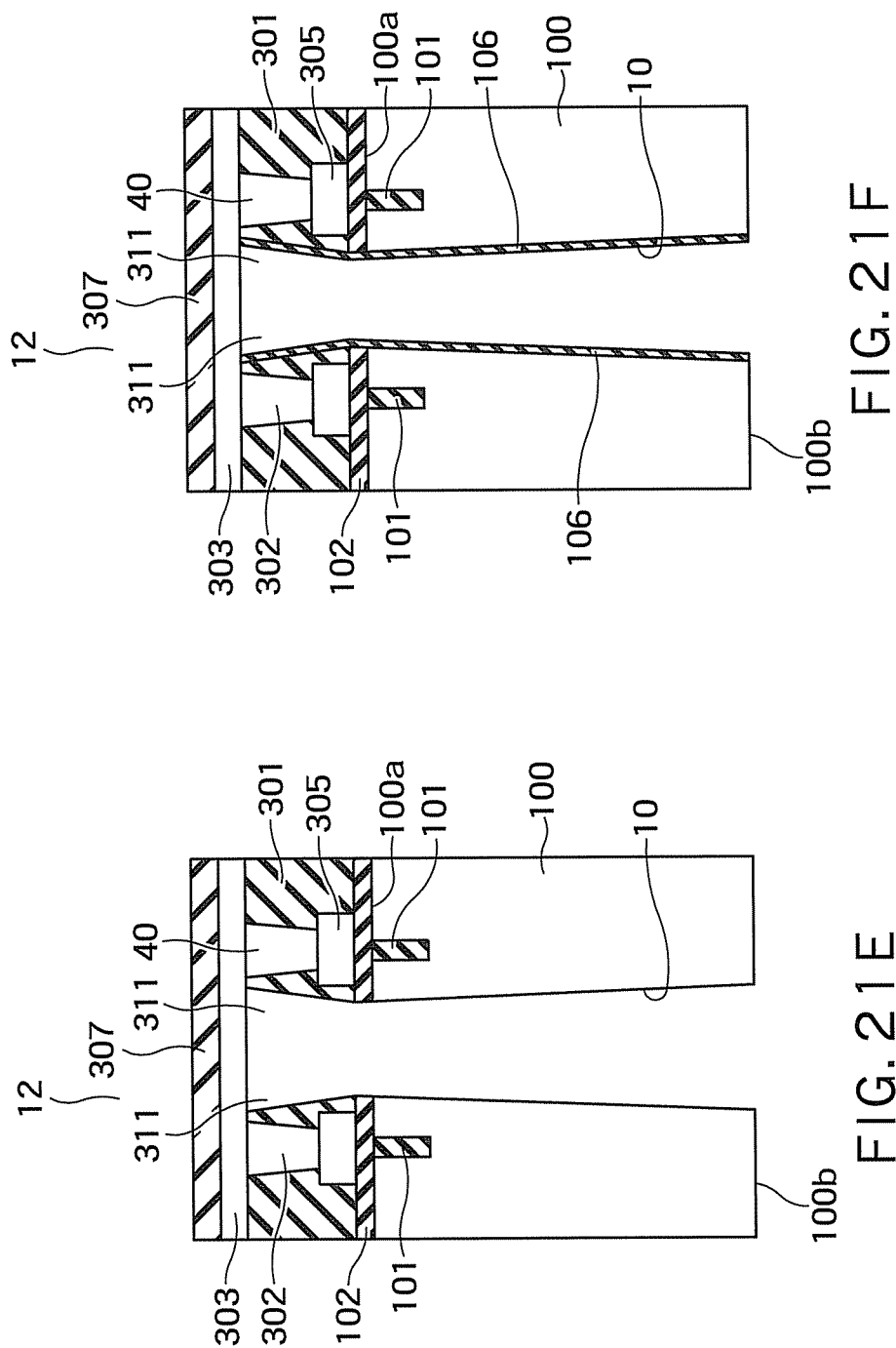

SEMICONDUCTOR DEVICE HAVING THROUGH ELECTRODE AND METHOD FOR MANUFACTURING THE SAME

CROSS-REFERENCE TO RELATED APPLICATION

This application is based upon and claims the benefit of priority from prior Japanese Patent Application No. 2012-156561, filed on Jul. 12, 2012, the entire contents of which are incorporated herein by reference.

FIELD

Embodiments of the present invention relate to a semiconductor device and a method for manufacturing the same.

BACKGROUND

In recent years, a through-silicon via (TSV) has been used in a semiconductor device in order to enhance an integration density of a circuit provided on the semiconductor device. This TSV is an electrode that passes vertically through a semiconductor substrate provided with a variety of elements, and for example, it can also be known as a method for reducing a delay due to connection wiring since being able to connect a plurality of laminated semiconductor substrates at a short distance.

BRIEF DESCRIPTION OF THE DRAWINGS

FIGS. 21A to 21F are views for explaining a manufacturing process for a semiconductor device according to a third embodiment.

DETAILED DESCRIPTION

According to one embodiment, a method for manufacturing a semiconductor device, includes: forming, on a first surface of a semiconductor substrate containing silicon, a ring-like insulating film having a ring-like shape as seen from the above of the first surface; sequentially laminating a first insulating film, a first silicon film and a first metal film on the first surface and the ring-like insulating film; forming an opening which passes through the semiconductor substrate, the first insulating film and the first silicon film from a second surface of the semiconductor substrate located on the opposite side to the first surface by use of the first metal film as a stopper, as well as passing through the inside of the ring of the ring-like insulating film, to reach the surface of the first metal film; forming a second insulating film so as to cover an inner wall of the opening; and embedding a second metal film into the opening, to form a through electrode connected with the first metal film.

Hereinafter, embodiments will be described with reference to the drawings. However, the present invention is not restricted to these embodiments. It is to be noted that a portion in common throughout the drawings is provided with a common numeral, and a repeated description thereof will be omitted. Further, the drawings are schematic views for explaining the invention and promoting understanding thereof, and some places may have shapes, sizes, ratios and the like different from those of an actual device, but these can be appropriately subjected to design changes in light of the following descriptions and known techniques.

First Embodiment

A method for manufacturing a semiconductor device according to the present embodiment by means of a BSV (Back Side Via) process will be described using FIGS. 1 to 7. Specifically, FIGS. 1 (a) to 7 (a) are sectional views in respective process steps of a method for manufacturing a semiconductor device, FIGS. 1 (b) to 7 (b) are top views seen from the above of a top surface (first surface) 100a of a semiconductor substrate 100 in the respective process steps, and FIGS. 1 (c) to 7 (c) are bottom views seen from the above of a bottom surface (second surface) 100b of the semiconductor substrate 100 in the respective process steps. Although there will here be described an example applied to such a BSV process as forming a variety of films, elements and the like on the top surface 100a and subsequently performing etching from the bottom surface 100b to form a TSV 11, the present invention is not restricted to this, and is applicable to a variety of semiconductor elements such as a nonvolatile semiconductor storage device like NAND flash memory, a semiconductor device having a semiconductor storage element, and a variety of processes.

Figure 1:
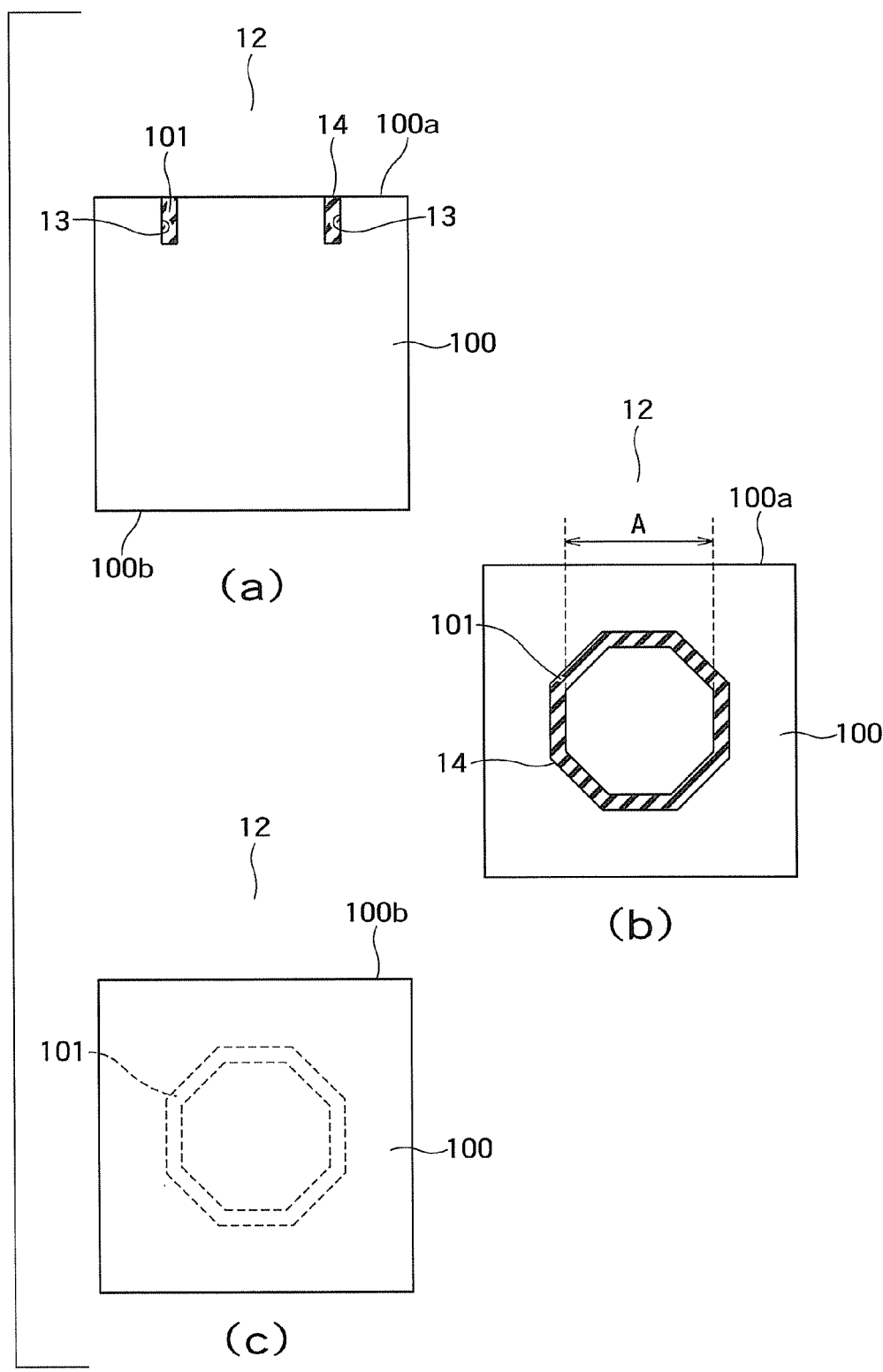
FIGS. 1 to 7 are views for explaining a manufacturing process for a semiconductor device according to a first embodiment.

First, on the top surface 100a of the semiconductor substrate 100 made up of a silicon substrate and having a film thickness of 38 μm, for example, a groove 13 for STI (Shallow Trench Isolation) is formed by means of a known etching method such as an RIE (Reactive Ion Etching) method. This groove 13 has a depth of 300 nm, for example, and has a ring-like shape as seen from the above of the top surface 100a. Although the groove 13 will be described hereinafter as having an octagonal ring-like shape, the groove 13 is not restricted to such a shape, and may have a circular ring-like shape or the like. Further, as shown in FIG. 1 (b), an inner diameter A of the octagonal ring-like groove is 14 μm, for example. However, this is not restrictive, and it can be selected in accordance with the size of a semiconductor device 12 or the like. Next, an insulating film (ring-like insulating film) 101, which is made up of an oxide silicon film (e.g. an oxide silicon film formed of tetraethyl orthosilicate (TEOS), silane plasma (P—SiH$_4$) or polysilazane (PSZ), or an oxide silicon film formed in combination of these) and has a film thickness of 300 nm, for example, is formed so as to fill this groove 13, thereby to obtain an STI 14 as shown in the sectional view of FIG. 1 (a) and the top view of FIG. 1 (b).

Figure 2:
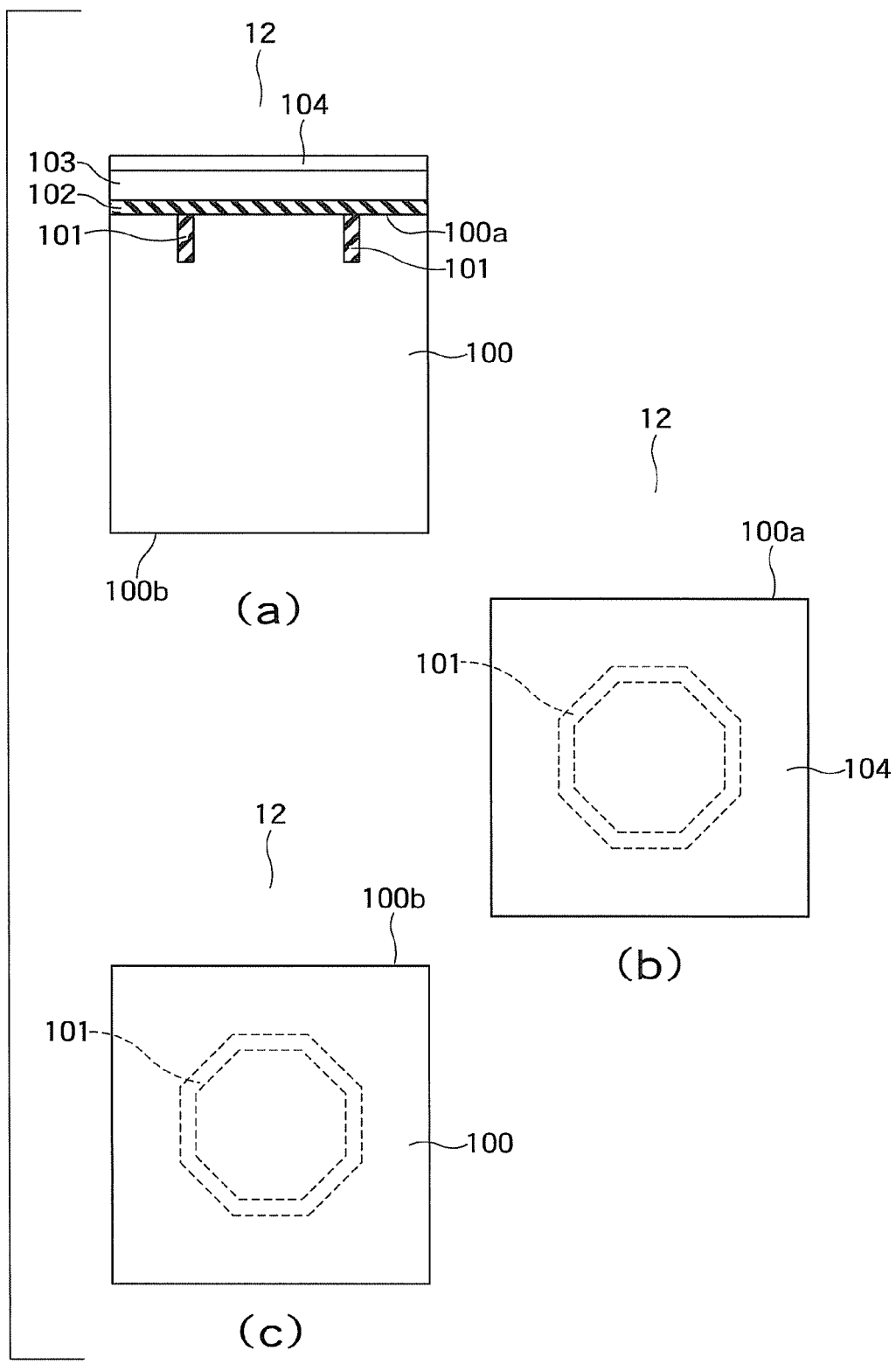

Further, an insulating film (first insulating film) 102, made up of a silicon oxide film, a silicon nitride film, a hafnium oxide film, aluminum oxide film or in combination of these, and having a film thickness of not larger than 20 nm, for example, is laminated on the top surface 100a and the insulating film 101. Further, a polysilicon film (silicon film) 103 having a film thickness of 60 nm to 100 nm, for example, and a metal film (first metal film) 104 made up of a nickel silicide film, a cobalt silicide film, a tungsten film, a tungsten nitride film or a combination of these and having a film thickness of 20 nm to 30 nm, for example, are sequentially laminated on the insulating film 102. In such a manner, a state as shown in FIG. 2 can be obtained. It is to be noted that the polysilicon film 103 is not restricted to a polysilicon film, and a silicon-series material film such as silicon-germanium film or one obtained by adding impurities to the polysilicon film can be used. Although not shown here, further, a film may be laminated or a semiconductor element or the like may be formed on the metal film 104.

Next, the semiconductor substrate 100, the insulating film 102 and the polysilicon film 103 are etched by means of the RIE method from the bottom surface 100b located on the opposite side to the top surface 100a toward the metal film 104. At this time, etching is performed on such a condition that selection ratios of materials constituting the semiconductor substrate 100 and the polysilicon film 103 are high with respect to the metal material constituting the metal film 104. By performing etching on such a condition, the metal film 104 made up of a material, which is different from the material to be etched, serves as a stopper of the etching. Therefore, as shown in the sectional view of FIG. 3 (a), an opening 10 is formed which passes through the semiconductor substrate 100, the insulating film 102 and the polysilicon film 103, as well as passing through the inside of the ring of the ring-like insulating film 101, to reach the surface of the metal film 104. In addition, although a material for the insulating film 102 is different from the material constituting the semiconductor substrate 100 and the polysilicon film 103, since the insulating film 102 has a film thickness of not larger than 20 nm, even when the etching is performed on such a condition as above, the insulating film 102 can be etched simultaneously with the semiconductor substrate 100 and the polysilicon film 103.

Figure 3:
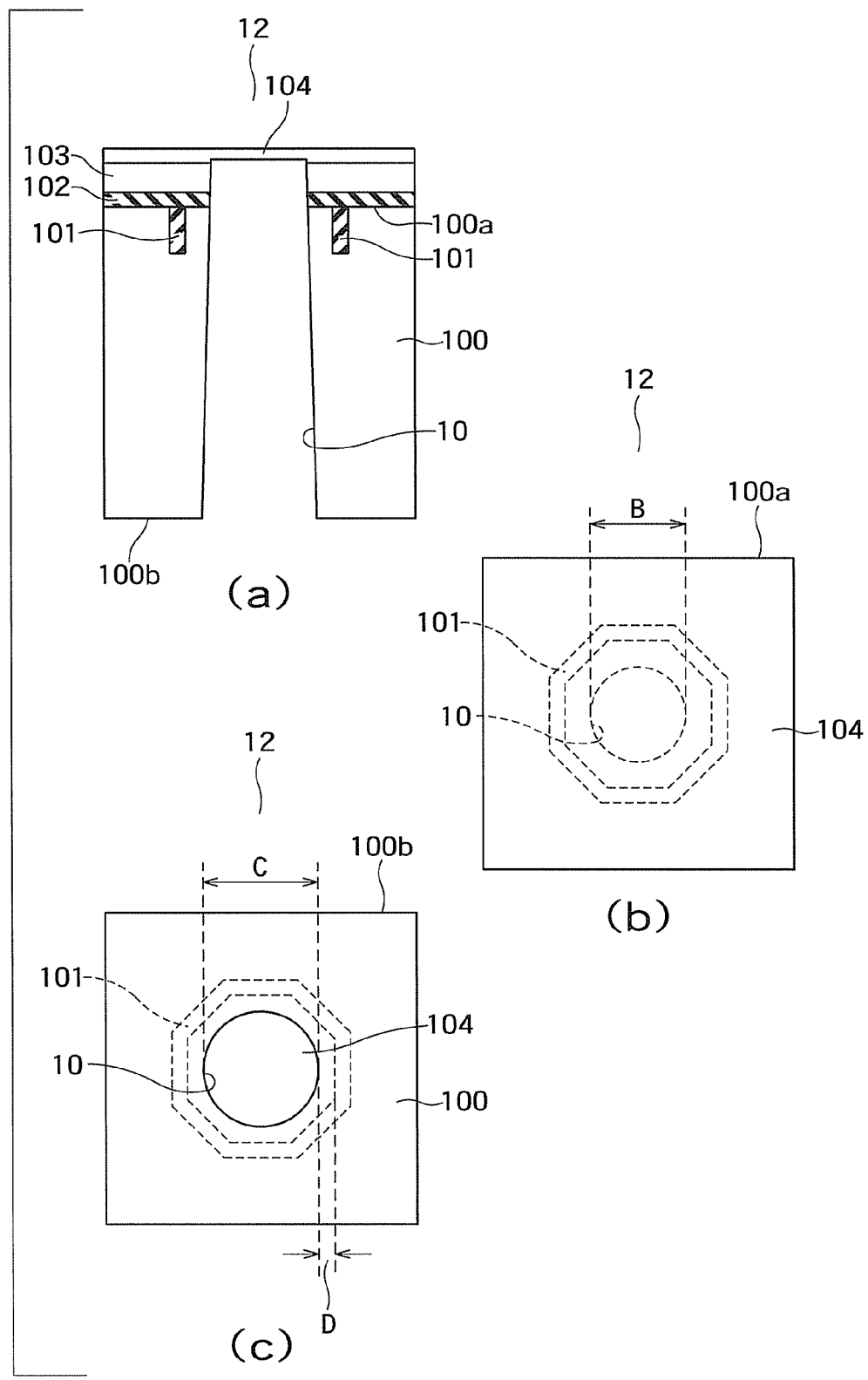
Figure 4:
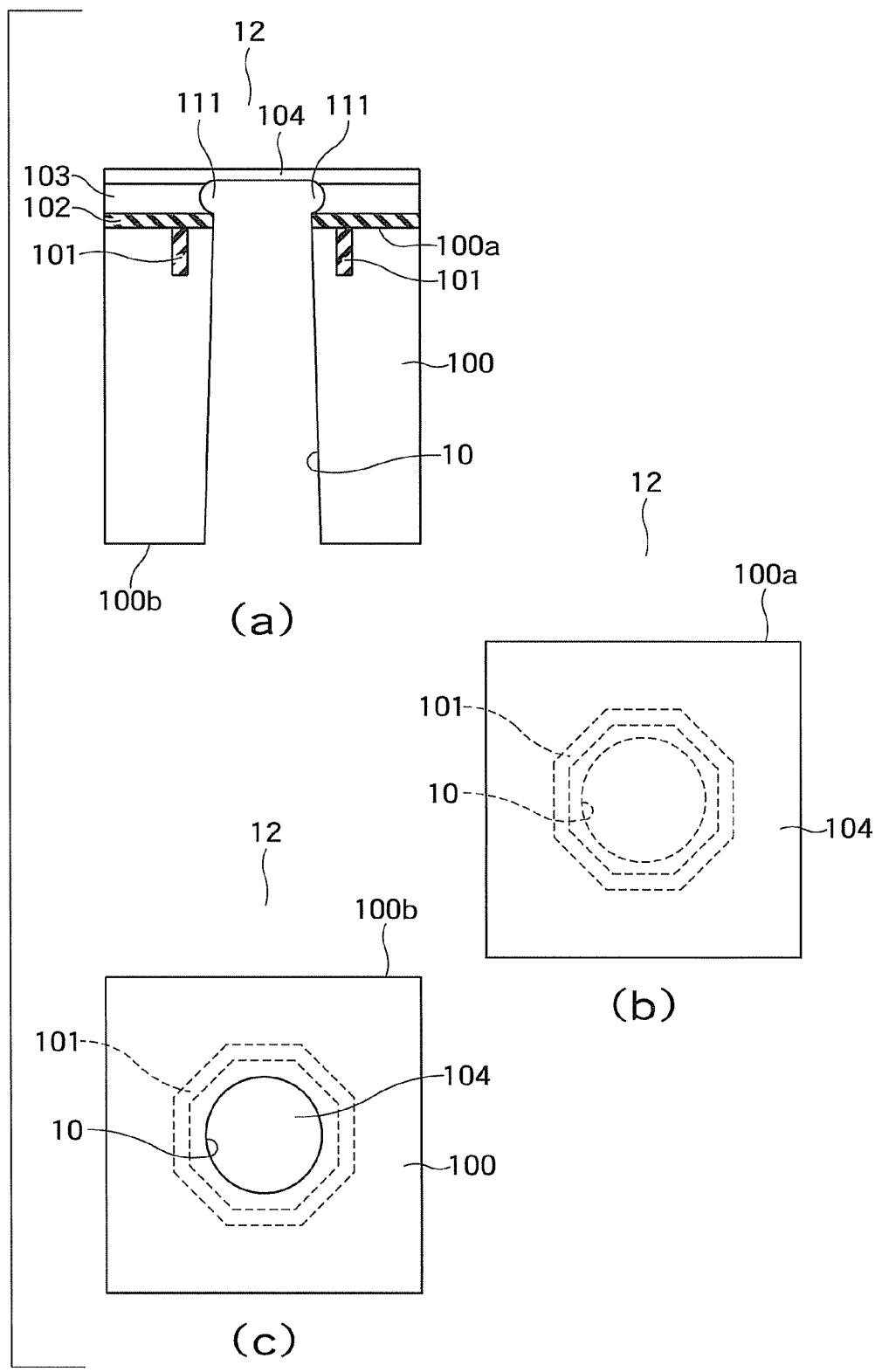

The opening 10 as thus formed is formed as a circular one as seen from the above of the bottom surface 100b as shown in the bottom view of FIG. 3 (c), and a diameter C of the opening 10 on the bottom surface 100b is 10 μm, for example. It is to be noted that, since the opening 10 may have a taper shape on its cross section, a diameter B of the opening 10 in the polysilicon film 103 is 9 μm, for example, as shown in the top view of FIG. 3 (b). However, the shape, size and the like of the opening 10 are not restricted to those shown in the Figure, and can be a variety of shapes and the like. Further, the opening 10 is formed so as to pass through the inside of the octagonal ring-like insulating film 101. The insulating film 101 is thick and thus difficult to etch simultaneously with other films, and hence the opening is formed as above for the purpose of performing etching while avoiding the insulating film 101 in order to simultaneously etch the semiconductor substrate 100, the insulating film 102 and the polysilicon film 103 and form the opening 10 in an efficient and uniform manner. Hence it is preferable to form the opening 10 such that part of the semiconductor substrate 100 is located between the opening 10 and the insulating film 101, and specifically, it is preferable to form the opening 10 so as to be separated from the inner wall of the ring-like insulating film 101 by not shorter than 2 μm (distance D shown in FIG. 3 (c)). However, the opening 10 may be in contact with the inner wall of the ring-like insulating film 101.

Next, additional RIE of the bottom surface 100b is performed for adjusting in-plane variations in the film thickness of the semiconductor substrate 100 to make the film thickness uniform. Since this additional RIE is performed on such a condition that selection ratios of the semiconductor substrate 100 and the polysilicon film 103 are high with respect to the metal film 104, it is difficult that etching proceeds in such a direction as to etch the metal film 104, and hence it proceeds in a lateral direction, namely in a direction to etch the polysilicon film 103. Therefore, as shown in the sectional view of FIG. 4 (a), a side notch (concave part) 111 may be generated in a portion of the polysilicon film 103 on the inner wall of the opening 10.

Figure 5:
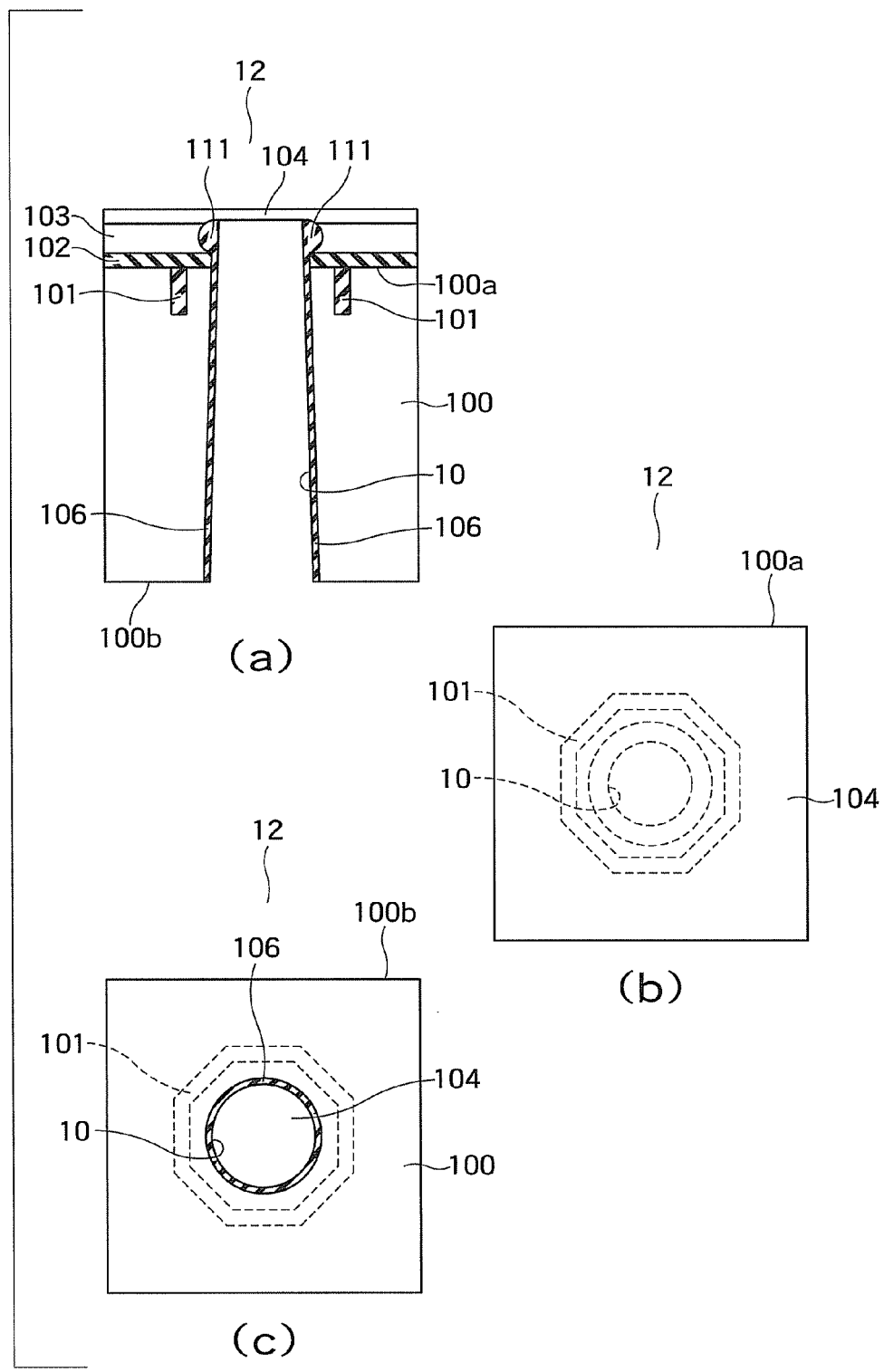

Then, as shown in the sectional view of FIG. 5 (a) and the bottom view of FIG. 5 (c), an insulating film (second insulating film) 106 made up of a silicon oxide film, a polyimide or the like by means of plasma TEOS is formed so as to cover the inner wall of the opening 10. The insulating film 106 preferably has such a film thickness as not to fill the opening 10 since the opening 10 will be later filled with a metal film (second metal film) 107. This is because, if the insulating film 106 becomes thick, it becomes difficult to fill the opening 10 with the metal film 107, thus leading to an increase in resistance value of the TSV 11 to be finally obtained. At this time, the side notch 111 has a small size due to the polysilicon film 103 having a small film thickness, thereby to allow the insulating film 106 to sufficiently fill the side notch 111. However, in the present embodiment, it may be possible not to sufficiently fill the side notch 111 with the insulating film 106.

Figure 6:
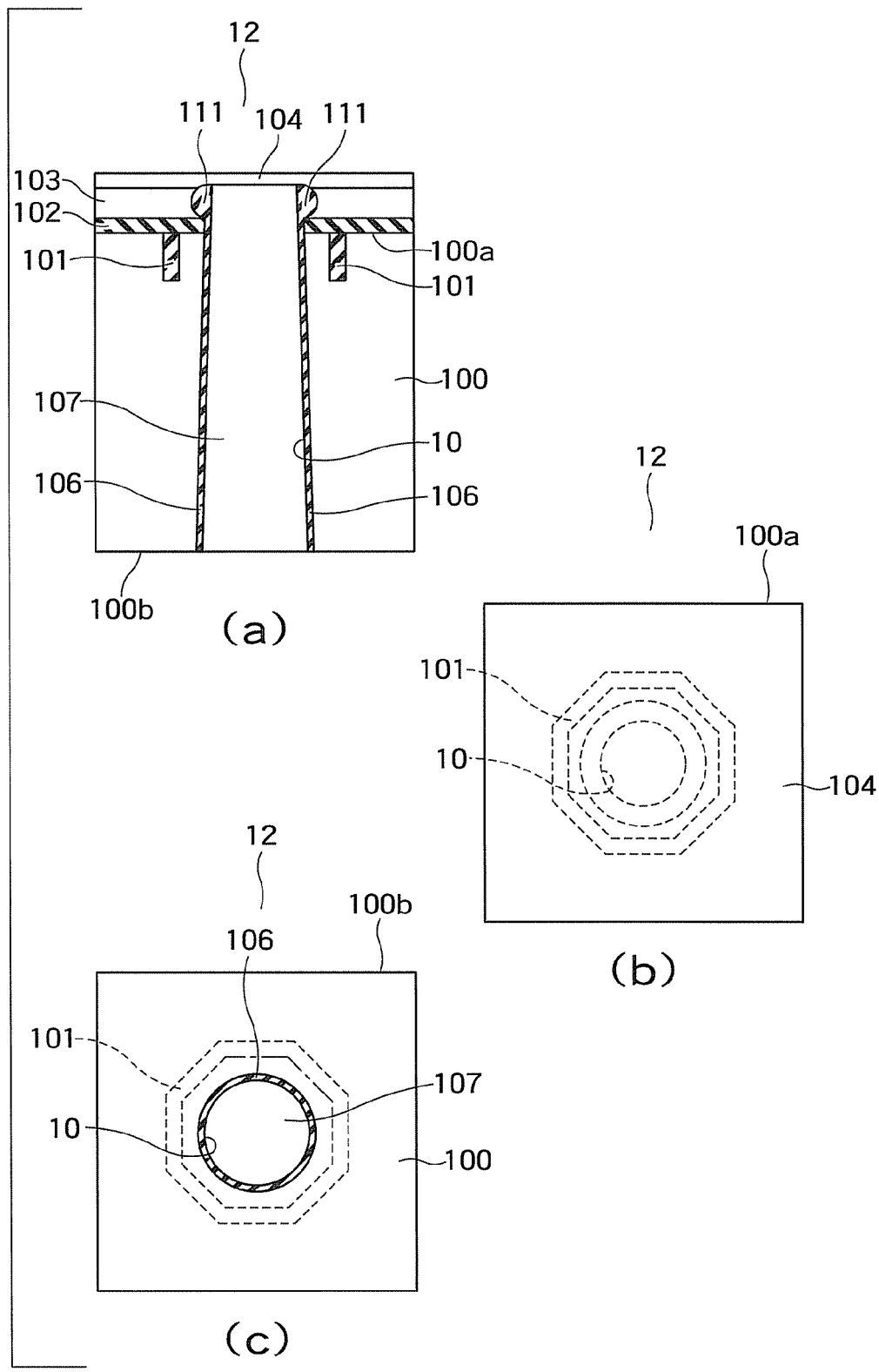

Further, as shown in the sectional view of FIG. 6 (a) and the bottom view of FIG. 6 (c), the metal film 107, made up of copper or the like, is embedded in the opening 10. As thus described, since the semiconductor substrate 100 on the inner wall of the opening 10 is covered by the insulating film 106, it is possible to avoid a short circuit between the metal film 107 and the semiconductor substrate 100.

Figure 7:
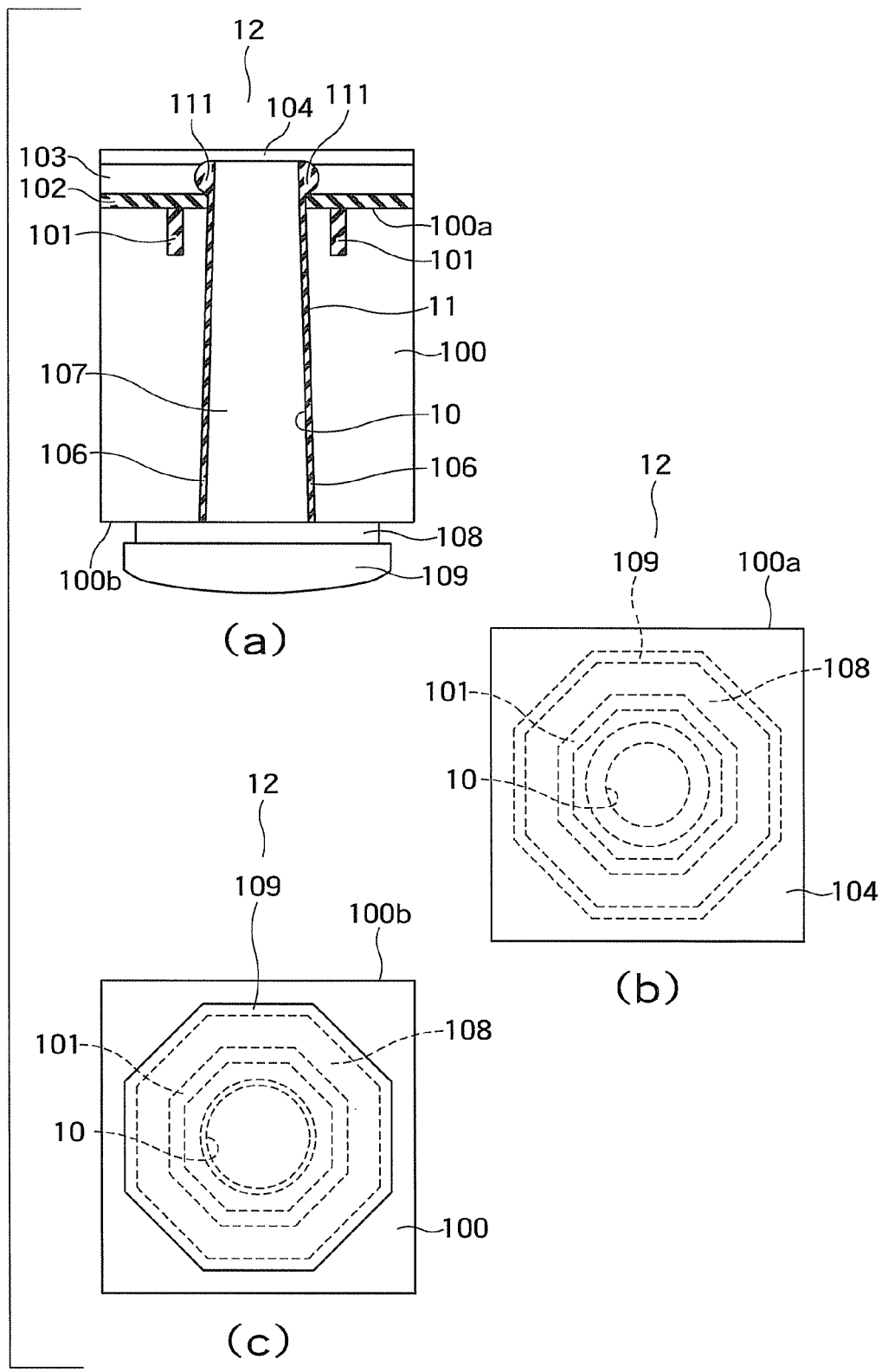

Then, a metal film 108 made up of nickel or the like is formed on the metal film 107, and a bump 109 made up of tin or the like is formed thereon, thereby to allow formation of a TSV 11 as shown in FIG. 7.

Figure 8:
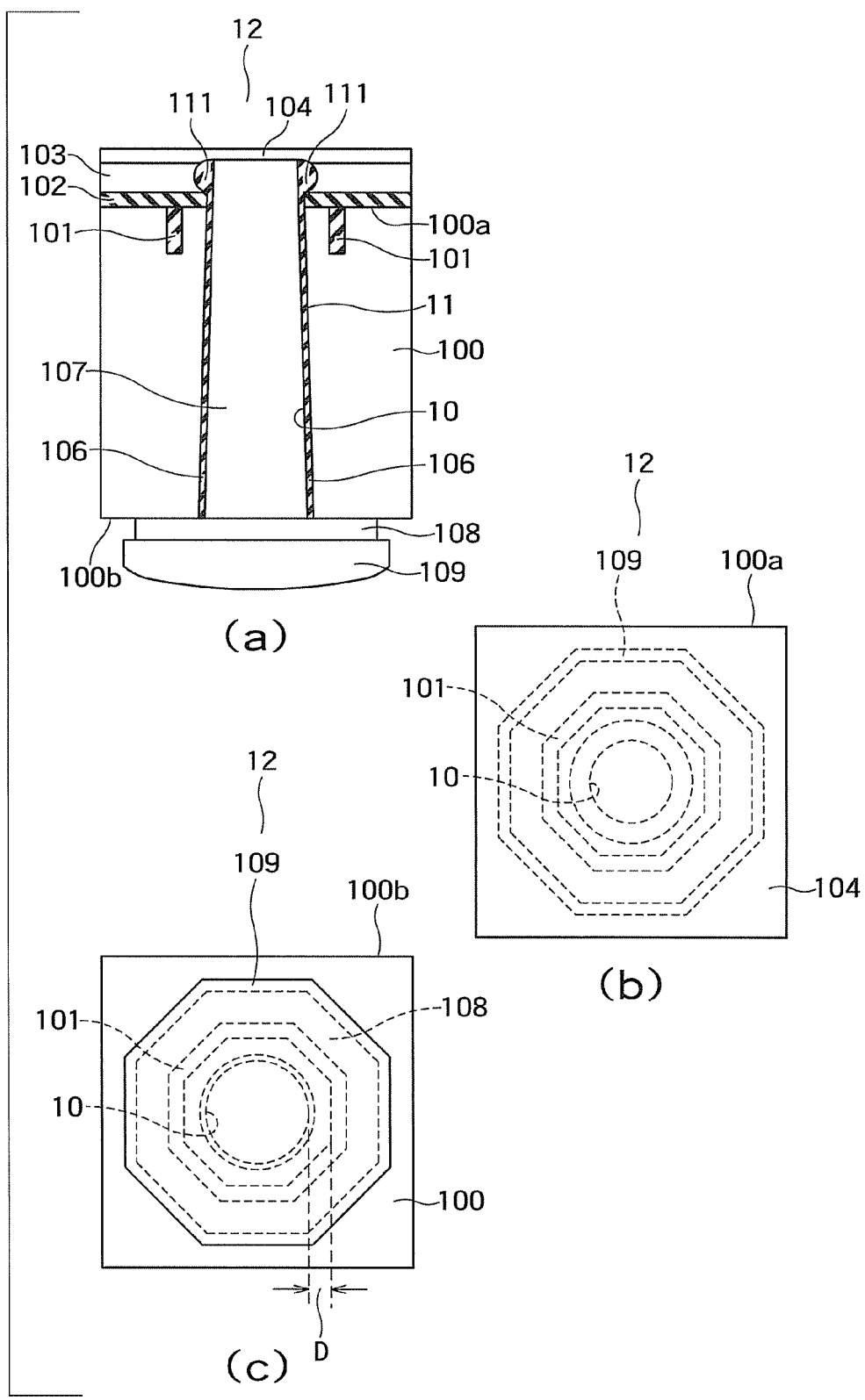
FIG. 8 is a view of the semiconductor device according to the first embodiment.

Next, the semiconductor device 12 according to the present embodiment will be described using FIG. 8. Specifically, FIG. 8 (a) is a sectional view of the semiconductor device 12, FIG. 8 (b) is a top view of the semiconductor device 12 seen from the above of the top surface 100a, and FIG. 8 (c) is a bottom view of the semiconductor device 12 seen from the above of the bottom surface 100b. As shown in FIG. 8, the semiconductor device 12 of the present embodiment has the semiconductor substrate 100, the insulating film 101 formed on the top surface 100a of the semiconductor substrate 100 and having a ring-like shape as seen from the above of the top surface 100a, the insulating film 102, the polysilicon film 103 and the metal film 104 which are sequentially formed on the top surface 100a and the insulating film 101, and the TSV 11. This TSV 11 has the opening 10 that passes through the semiconductor substrate 100, the insulating film 102 and the polysilicon film 103 from the bottom surface 100b of the semiconductor substrate 100, as well as passing through the inside of the ring of the ring-like insulating film 101, to reach the surface of the metal film 104, the insulating film 106 formed so as to cover the inner wall of the opening 10, the metal film 107 embedded in the opening, the metal film 108 formed on the metal film 107, and the bump 109. Specifically, the insulating film 102 is very thin with respect to the semiconductor substrate 100, and has a film thickness of not larger than 20 nm, for example. Further, part of the semiconductor substrate 100 is preferably located between the opening 10 and the insulating film 101, and more specifically, the opening 10 is preferably separated from the inner wall of the ring-like insulating film 101 by not shorter than 2 μm (distance D shown in FIG. 8 (c)).

It should be noted that as described above, a plurality of films, a semiconductor or the like may be provided on the metal film 104. Moreover, although the TSV 11 is formed for example on the outer periphery of the semiconductor device 12, it is not restricted to this position, and may be formed in a variety of places in the semiconductor device 12.

According to the present embodiment, in the TSV 11, it is possible to avoid a short circuit between the metal film 107 and the semiconductor substrate 100, and is further possible to improve a yield of the semiconductor device 12. A detail thereof will be described below.

Hereinafter, a method for manufacturing the semiconductor device 12, which the present inventor has hitherto performed, will be described as a comparative example using FIGS. 9 to 14. Specifically, FIGS. 9 (*a*) to 14 (*a*) are sectional views in respective process steps of the manufacturing method of the comparative example, FIGS. 9 (*b*) to 14 (*b*) are top views in the respective process steps of the comparative example, and FIGS. 9 (*c*) to 14 (*c*) are bottom views in the respective process steps of the comparative example.

Figure 9:
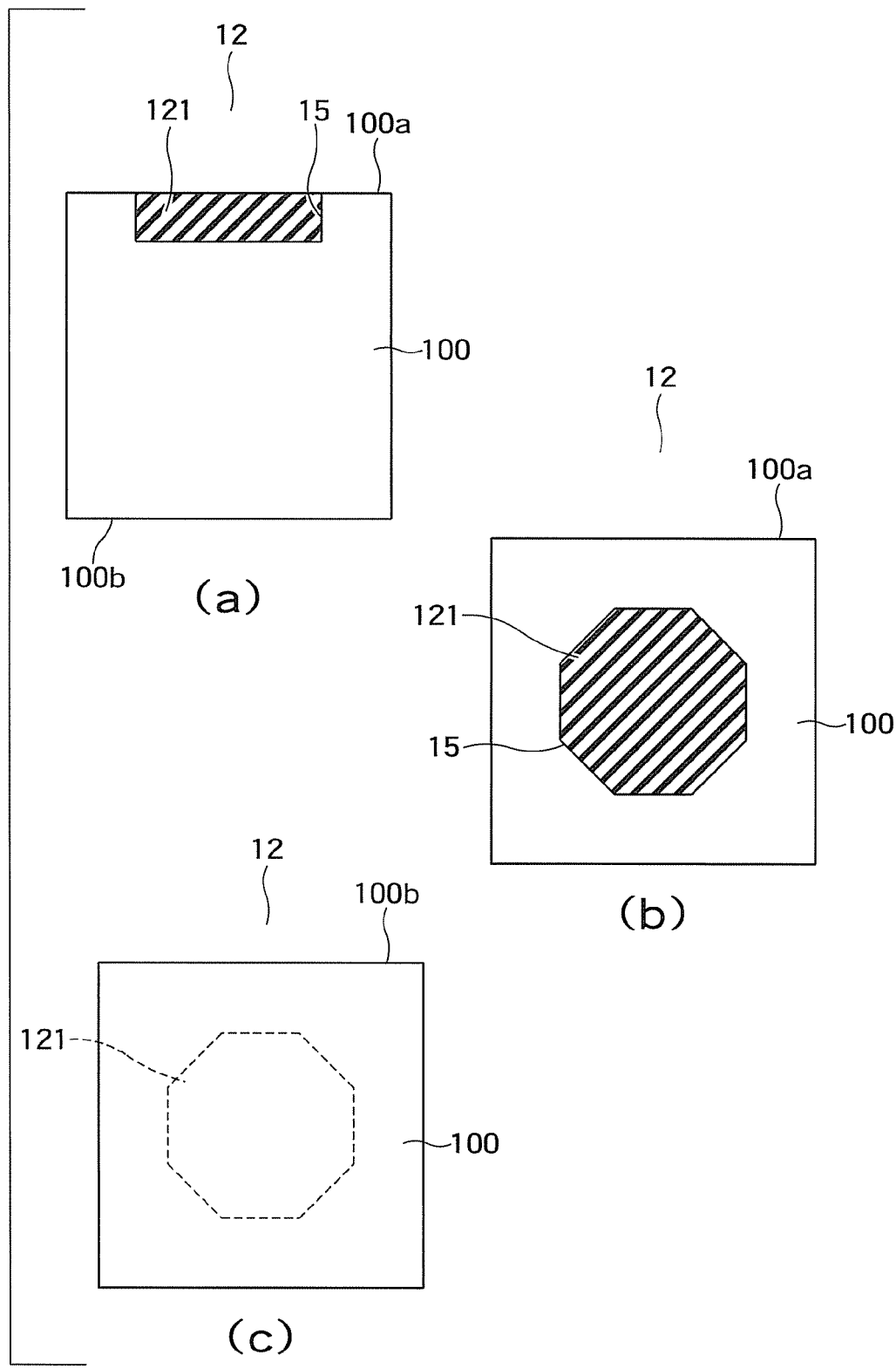
FIGS. 9 to 14 are views for explaining a manufacturing process for a semiconductor device of a comparative example.

First, as shown in the sectional view of FIG. 9 (*a*) and the top view of FIG. 9 (*b*), a concave part 15 is formed on the top surface 100*a* of the semiconductor substrate 100 made up of a silicon substrate, and an insulating film 121 made up of a silicon oxide film, for example, is formed so as to fill the concave part 15. It is to be noted that this concave part 15 has a depth of 300 nm, for example, and has a shape being not ring-like, and circular, octagonal, or the like as seen from the above of the top surface 100*a*. The reason for forming the insulating film 121 in such a shape is to use the insulating film 121 as a stopper in formation of the opening 10.

Figure 10:
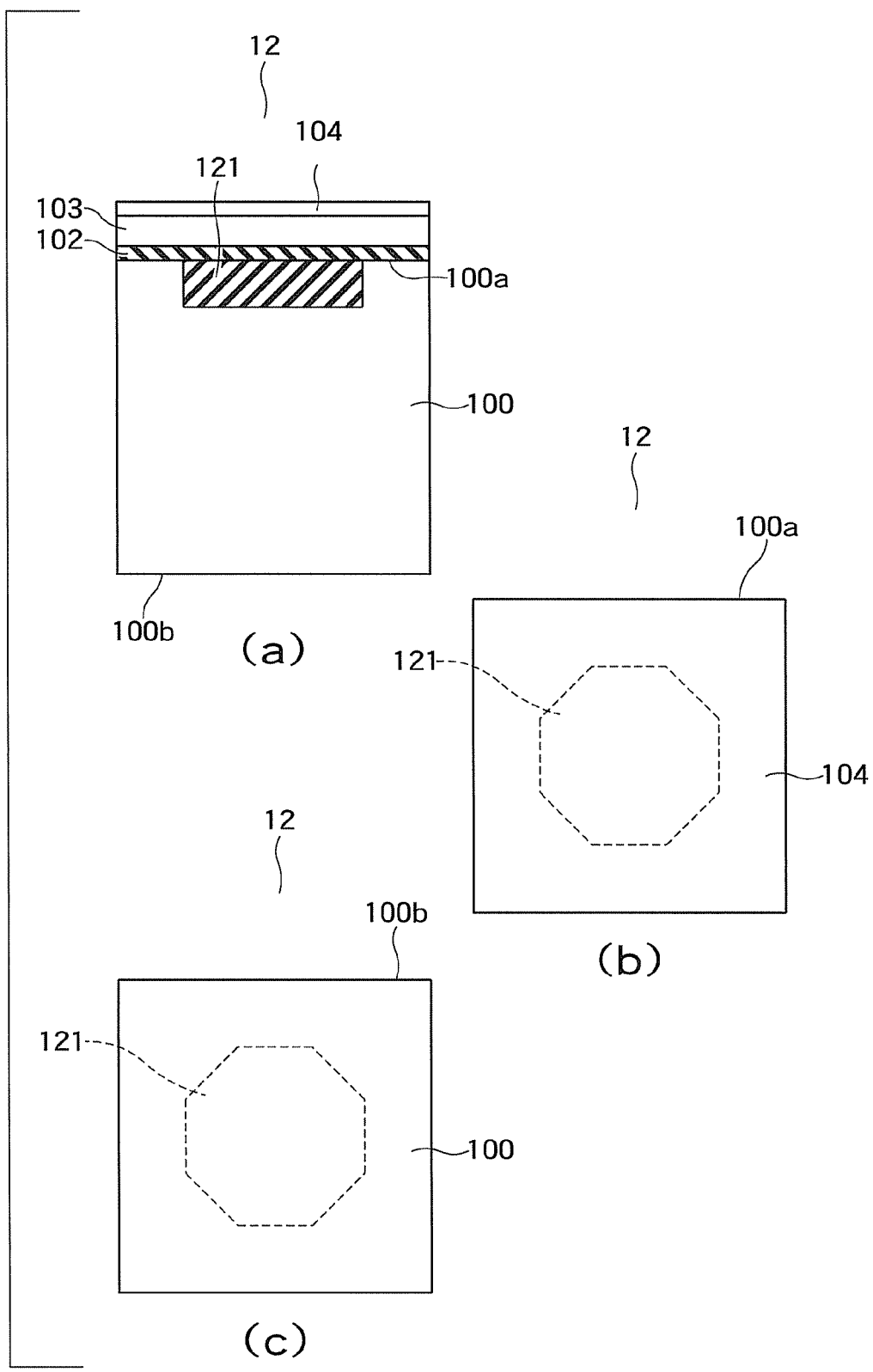
Figure 11:
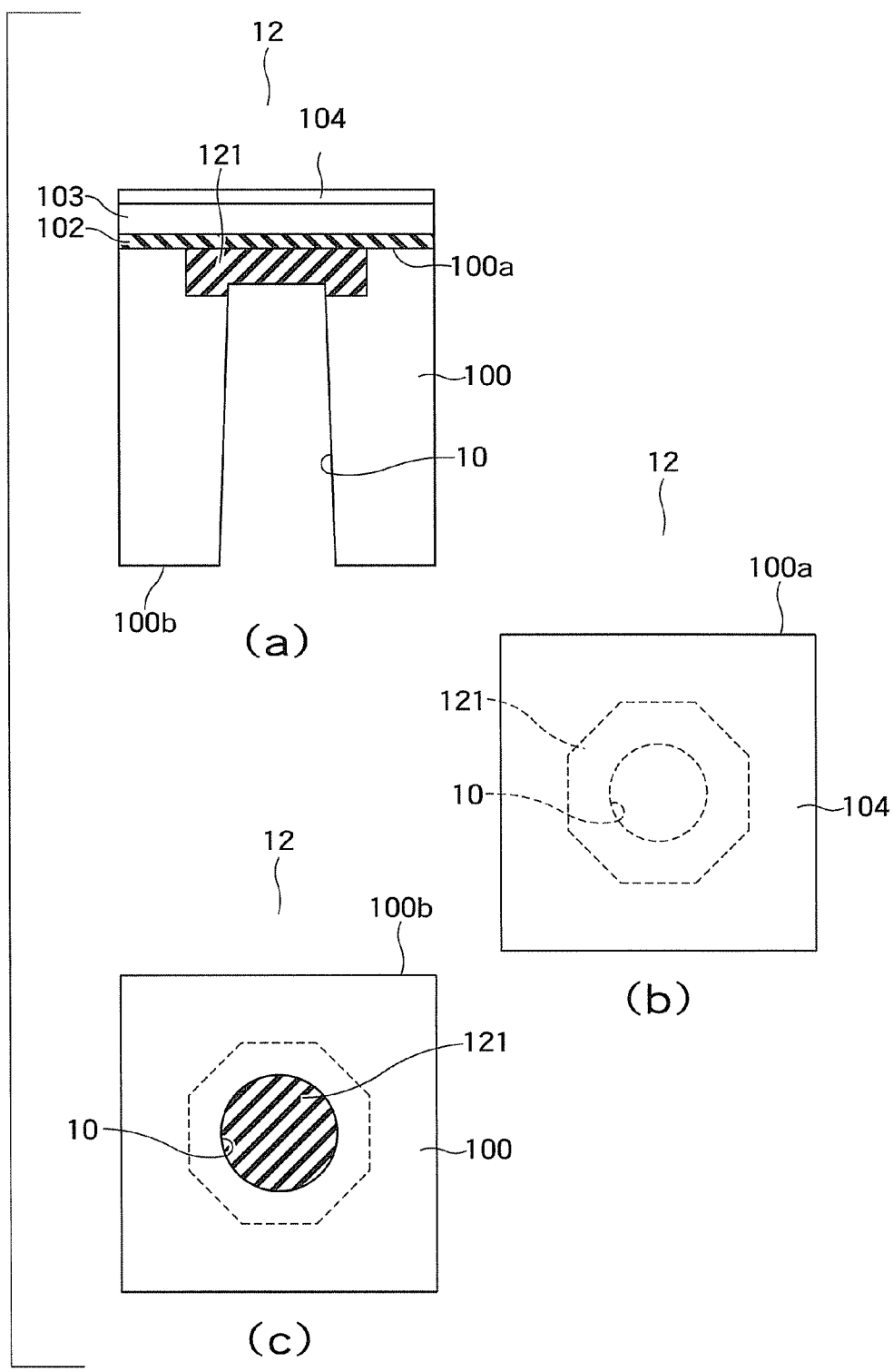
Figure 12:
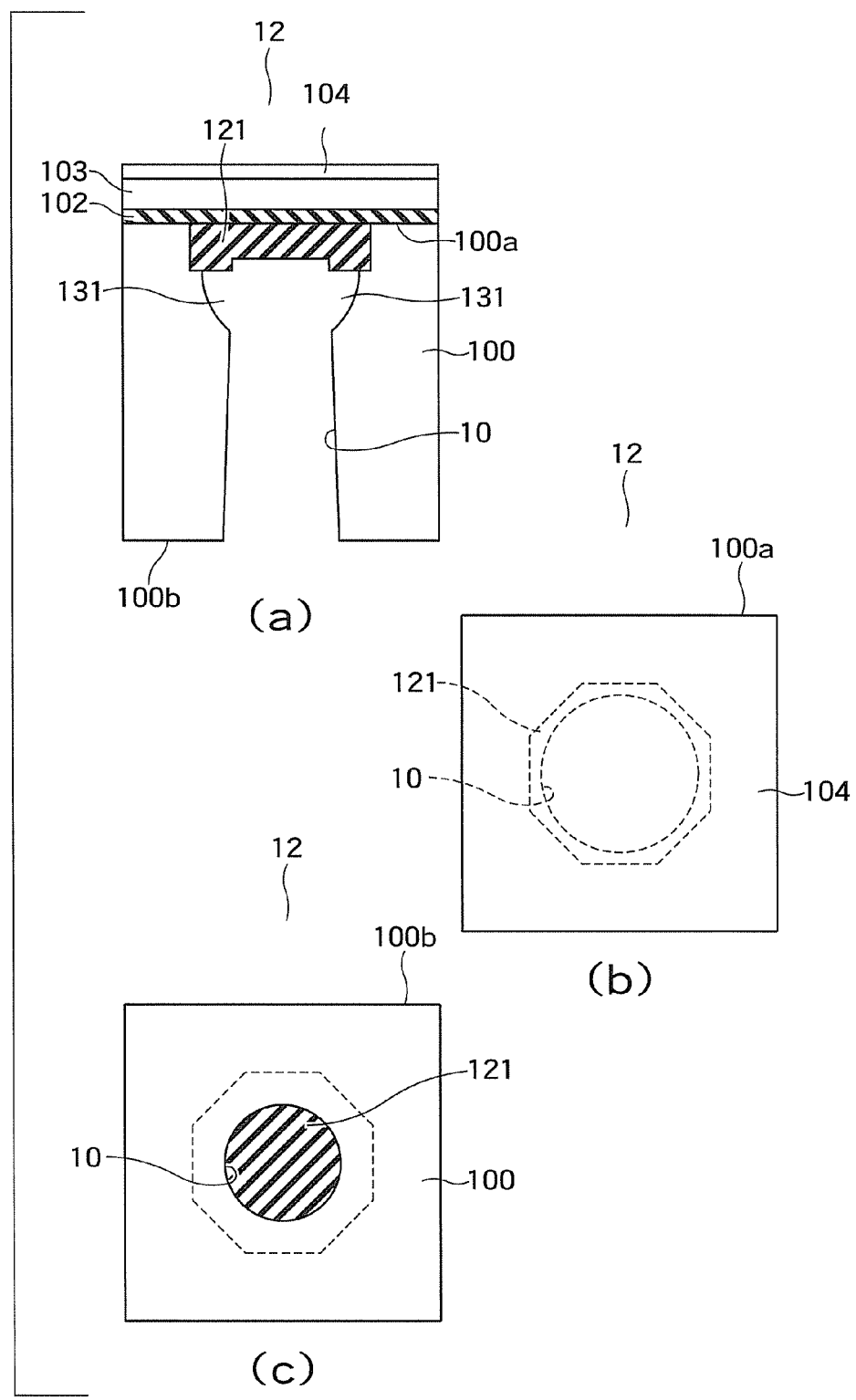

Further, as shown in the sectional view of FIG. 10 (*a*) and the top view of FIG. 10 (*b*), the insulating film 102, the polysilicon film 103 and the metal film 104 are sequentially laminated on the top surface 100*a* and the insulating film 121 in the same manner as the present embodiment.

Next, the semiconductor substrate 100 is etched by means of the RIE method from the bottom surface 100*b* on a condition that a selection ratio of the semiconductor substrate 100 is high with respect to the insulating film 121. Since the insulating film 121 made up of a different material from the semiconductor substrate 100 serves as a stopper of the etching, the opening 10 that passes through the semiconductor substrate 100 is formed as shown in the sectional view of FIG. 11 (*a*).

Next, additional RIE is performed for adjusting variations in the film thickness of the semiconductor substrate 100 in the same manner as the present embodiment. In this additional RIE, since the selection ratio is sufficient with respect to the insulating film 121, it is difficult that etching proceeds in such a direction as to etch the metal insulating film 121, and it proceeds in a lateral direction, namely in a direction to etch the semiconductor substrate 100. Therefore, as shown in the sectional view of FIG. 12 (*a*), a side notch 131 may be generated in a portion of the semiconductor substrate 100 on the inner wall of the opening 10. Further, in this comparative example, with the semiconductor substrate 100 having a large thickness, the side notch 131 of a larger size may be generated as compared with the side notch 111 in the present embodiment.

Figure 13:
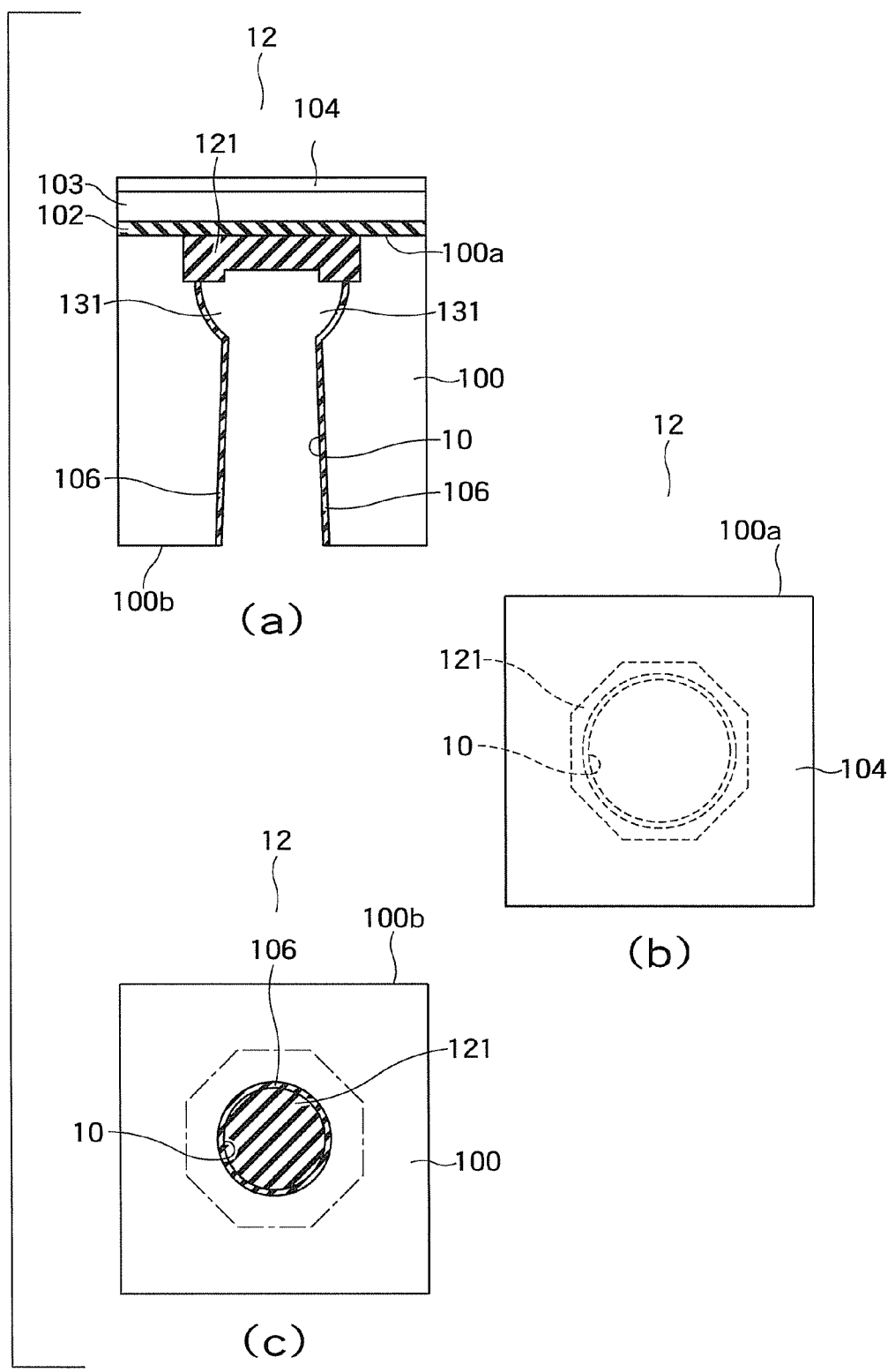

Then, similar to the present embodiment, as shown in the sectional view of FIG. 13 (*a*) and the bottom views of FIG. 13 (*c*), the insulating film 106 is formed so as to cover the inner wall of the opening 10. As described above, the insulating film 106 is preferably thin, and it is thus difficult to form the insulating film 106 so as to completely fill the side notch 131. Additionally, since the size of the generated side notch 131 does not remain unchanged, it is further difficult to form the insulating film 106 so as to completely fill the side notch 131. Hence the insulating film 106 formed on the portion of the side notch 131 becomes extremely thin, or the insulating film 106 is not formed on the portion of the side notch 131.

Figure 14:
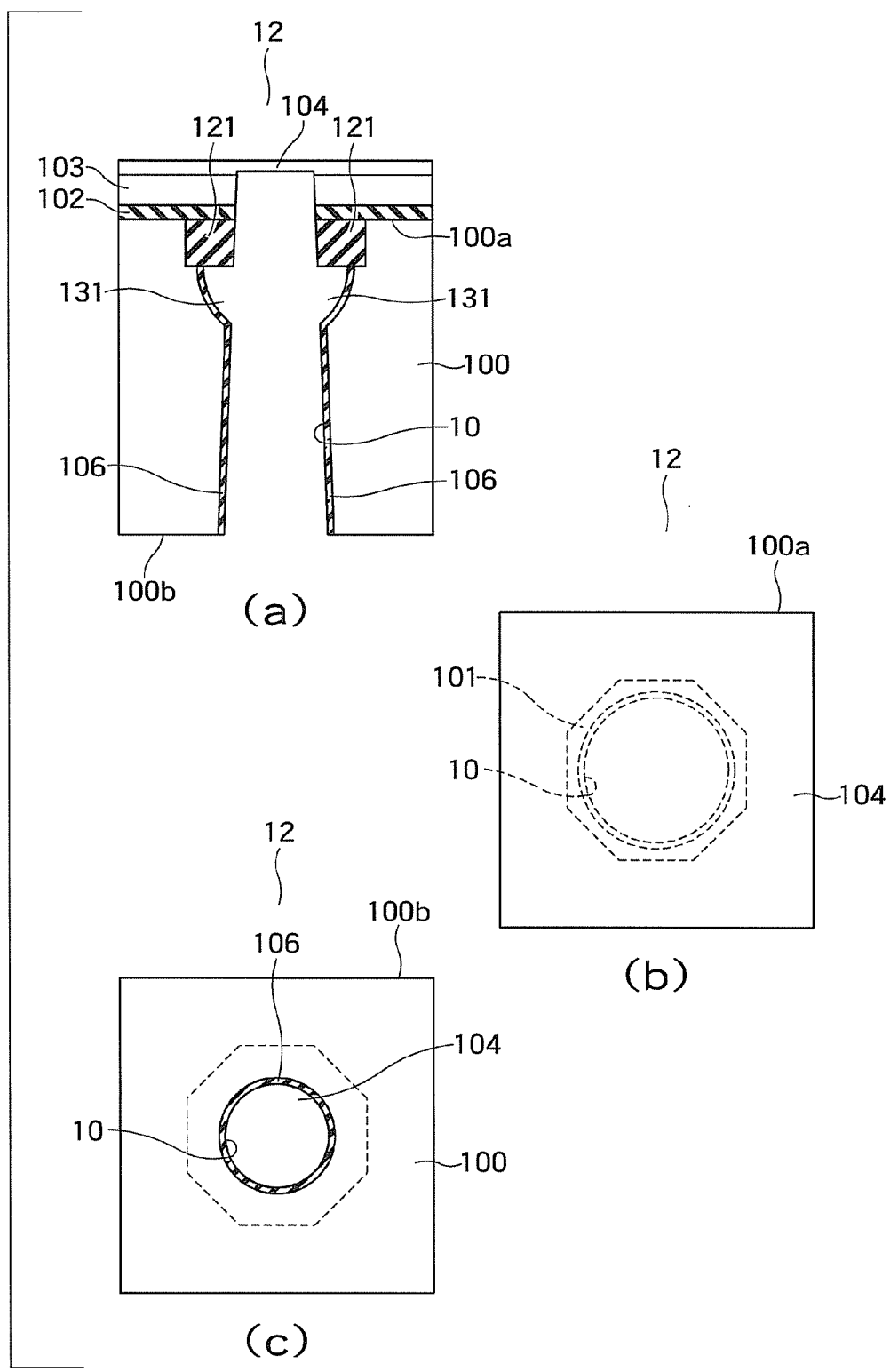
Figure 15:
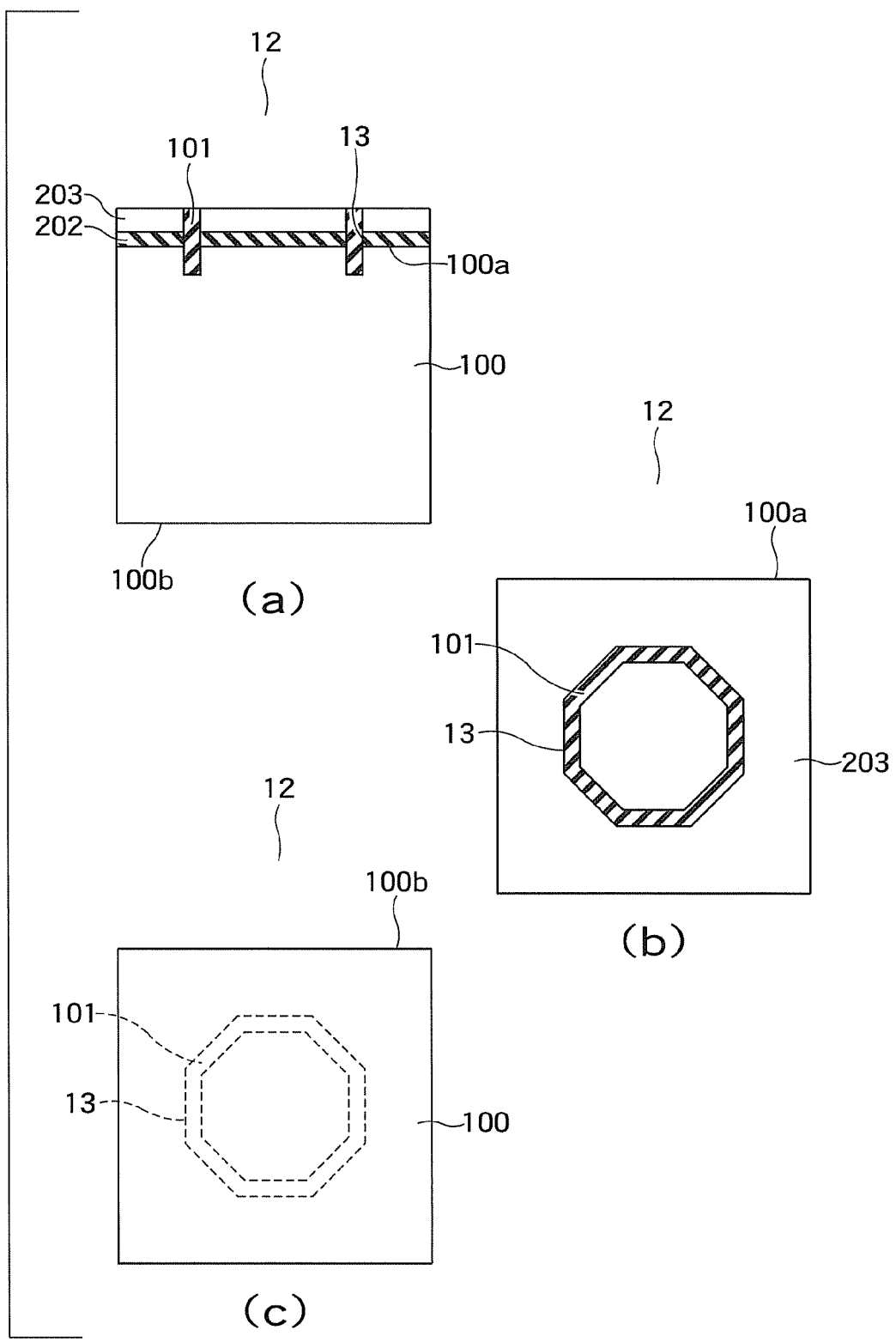
FIGS. 15 to 19 are views for explaining a manufacturing process for a semiconductor device according to a second embodiment.

Moreover, as shown in the sectional view of FIG. 14 (*a*) and the bottom view of FIG. 14 (*c*), the opening 10 that passes through the semiconductor substrate 100, the insulating film 121, the insulating film 102 and the polysilicon film 103 is formed by means of the RIE method on a condition that selection ratios of the insulating film 121, the insulating film 102 and the polysilicon film 103 are high with respect to the metal film 104. Specifically, in this comparative example, the opening 10 is in contact with the insulating film 121. In other words, the semiconductor substrate 100 does not exist between the opening 10 and the insulating film 121.

In addition, there will be described below the reason why, in formation of the opening 10, etching is not performed to the surface of the metal film 104 at a time, but etching is first performed to the surface of the insulating film 121 and then performed to the surface of the metal film 104. The insulating film 121 is a very thick one as compared with the insulating film 102, the polysilicon film 103 and the metal film 104. When such a thick insulating film 121 and a similarly thick semiconductor substrate 100 are simultaneously etched to form the opening 10, it might pass through the metal film 104. Accordingly, in order to avoid passage through the metal film 104, etching is first performed to the surface of the insulating film 121, and etching is then performed to the surface of the metal film 104 on a different condition.

Further, in the same manner as the present embodiment, the metal film 107 is embedded in the opening 10, and the metal film 108 and the bump 109 are formed on this metal film 107, to form the TSV 11, but detailed descriptions thereof will be omitted since being similar to the present embodiment.

In this comparative example, as apparent from the sectional view of FIG. 13 (*a*), since the insulating film 106 formed on the portion of the side notch 131 is extremely thin, or since the insulating film 106 cannot be formed on the portion of the side notch 131, the metal film 107 embedded in the opening 10 and the semiconductor substrate 100 are short-circuited.

On the other hand, in the present embodiment described above, the semiconductor substrate 100, the insulating film 102 and the polysilicon film 103 are simultaneously etched, thereby to set a place where the side notch 111 is generated not to the portion of the semiconductor substrate 100 on the inner wall of the opening 10, but to the portion of the polysilicon film 103 on the inner wall of the opening 10. Hence, according to the present embodiment, since the side notch 111 is not generated in the portion of the semiconductor substrate 100 on the inner wall of the opening 10, the insulating film 106 can be formed so as to cover the portion of the semiconductor substrate 100 on the inner wall of the opening 10, so as to avoid short-circuiting of the metal film 107 and the semiconductor substrate 100. This can improve the yield of the semiconductor device 12. Further, in the present embodiment, due to the polysilicon film 103 having a small film thickness, the size of the side notch 111 is small as compared with the size of the side notch 131 of the comparative example, thereby to facilitate filling of the side notch with the insulating film 106.

Moreover, the present embodiment can be performed without significantly changing a manufacturing process for a semiconductor device which has hitherto been used.

Second Embodiment

A second embodiment is different from the first embodiment in that an insulating film 202 and a polysilicon film 203 are further laminated on the top surface 100*a*. That is, the present embodiment is also applicable to such a structure.

Hereinafter, a method for manufacturing the semiconductor device 12 according to the present embodiment will be described using FIGS. 15 to 19. Specifically, FIGS. 15 (a) to 19 (a) are sectional views in respective process steps of the manufacturing method of the present embodiment, FIGS. 15 (b) to 19 (b) are top views seen from the above of the top surface 100a in the respective process steps, and FIGS. 15 (c) to 19 (c) are bottom views seen from the above of the bottom surface 100b in the respective process steps. It is to be noted that a description of a portion in common with the first embodiment will be omitted. Further, similar to the first embodiment, although an example applied to the BSV process will be described here, the present invention is not restricted to this, and is applicable to a variety of semiconductor elements such as a nonvolatile semiconductor storage device, a semiconductor device having a semiconductor storage element, and a variety of processes.

First, on the top surface 100a of the semiconductor substrate 100, the insulating film 202 made up of a silicon oxide film or the like and having a film thickness of not larger than 20 nm, for example, and the polysilicon film 203 having a film thickness of 60 nm to 100 nm, for example, are sequentially laminated. Next, the groove 13 is formed on the top surface 100a by use of the RIE method or the like in the same manner as the first embodiment. This groove 13 has a ring-like shape as seen from the above of the top surface 100a. Further, the insulating film 101 made up of silicon oxide or the like is formed so as to fill this groove 13. In such a manner, a structure shown in FIG. 15 can be obtained.

Figure 16:
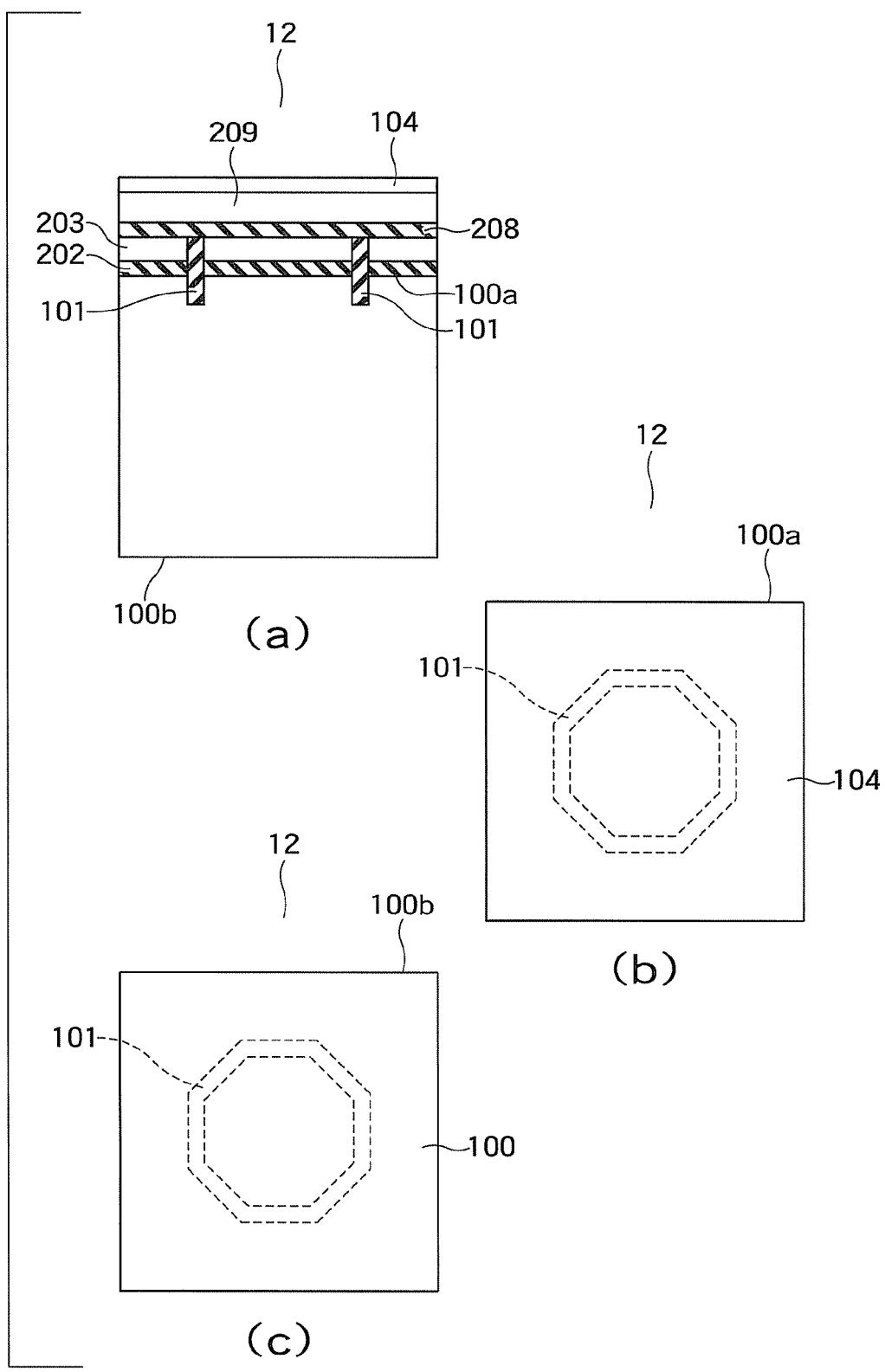

First, as shown in the sectional view of FIG. 16 (a) and the top view of FIG. 16 (b), on the top surface 100a and the insulating film 101, an insulating film 208 made up of a silicon oxide film or the like and having a film thickness of not larger than 20 nm, for example, a polysilicon film 209 having a film thickness of 60 nm to 100 nm, for example, and the metal film 104 made up of nickel silicide or the like and having a film from 20 nm to 30 nm, for example, are sequentially laminated.

Figure 17:
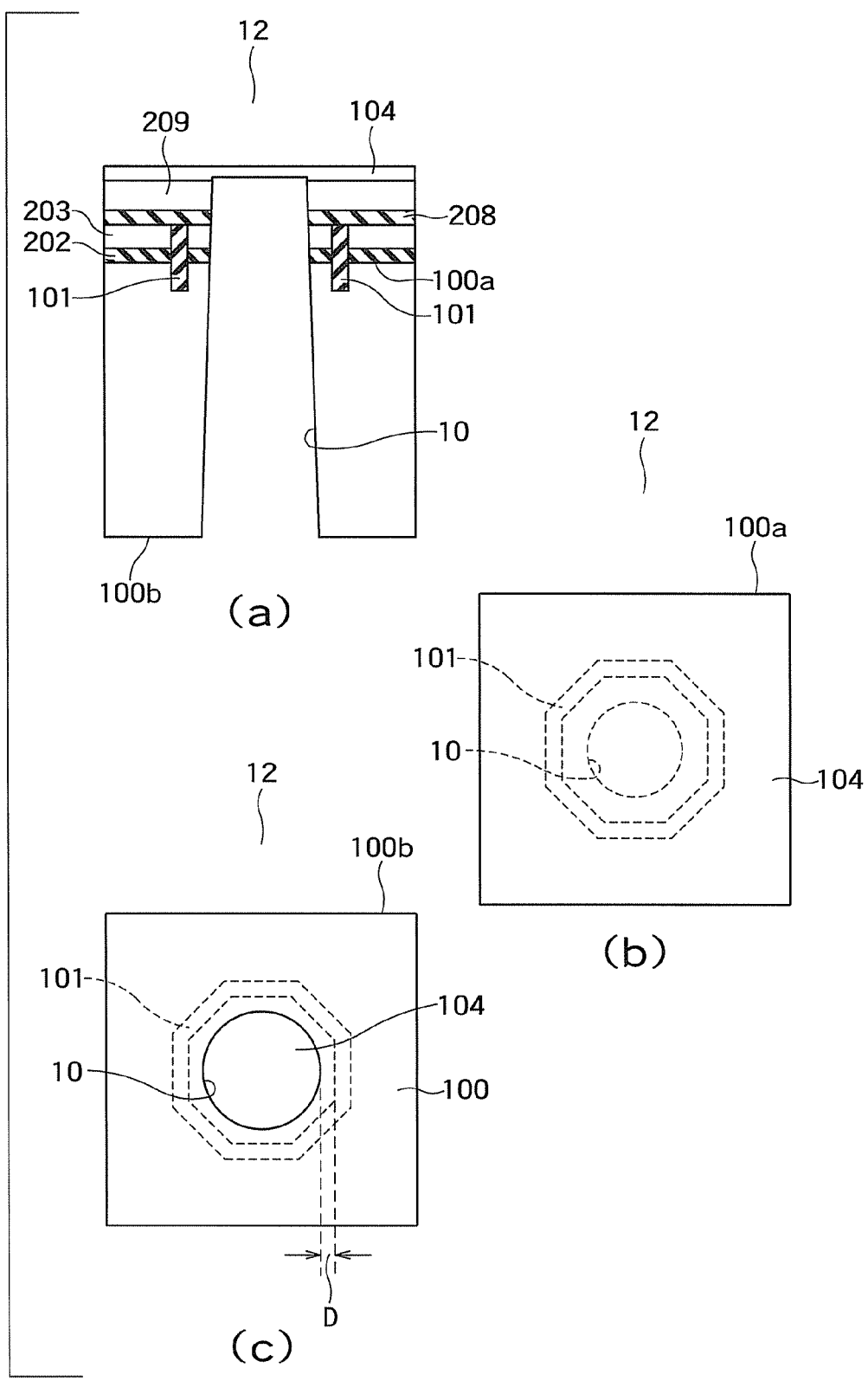
Figure 18:
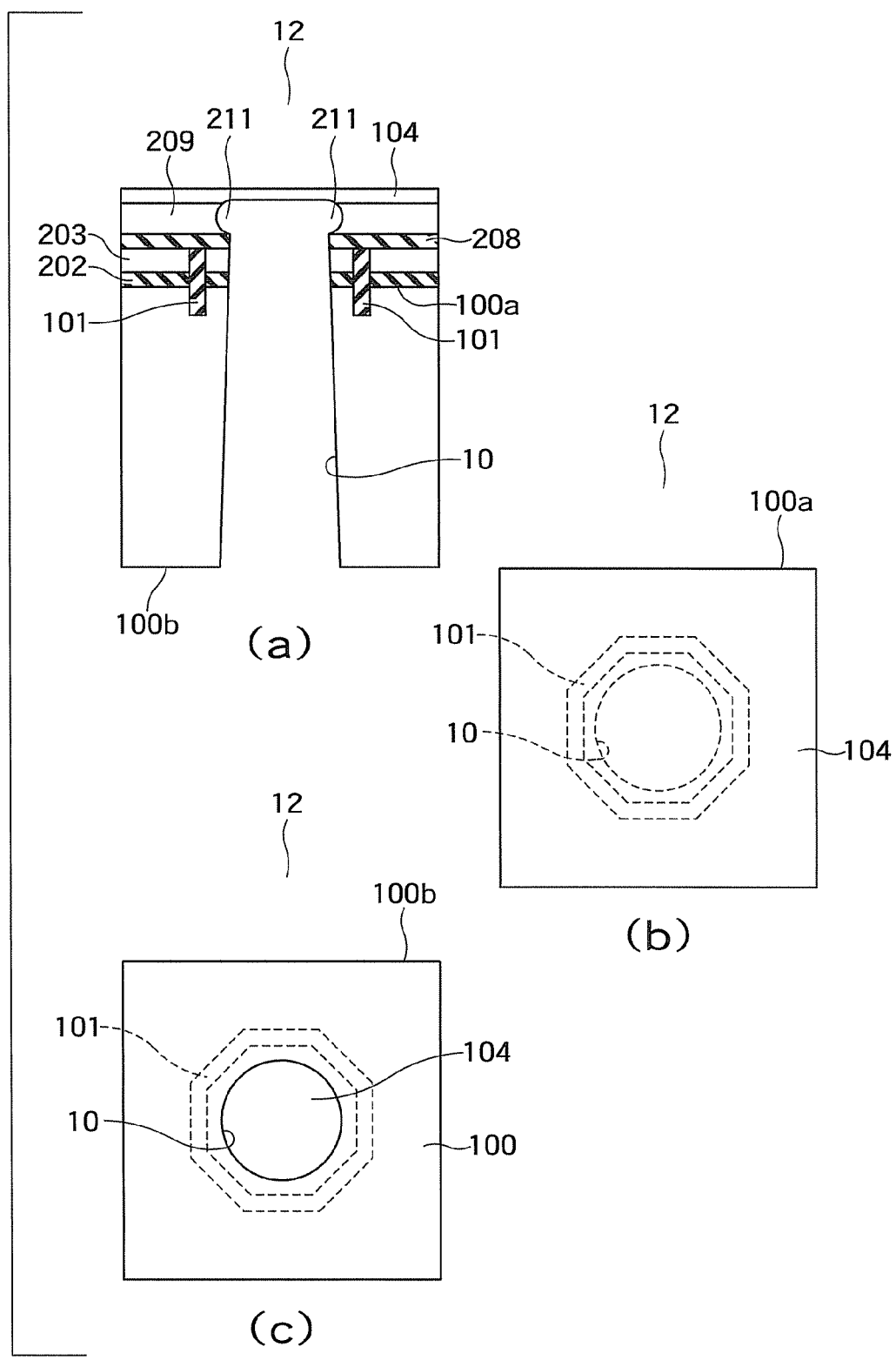

Moreover, as shown in the sectional view of FIG. 17 (a), the opening 10 that passes through the semiconductor substrate 100, the insulating film 202, the polysilicon film 203, the insulating film 208 and the polysilicon film 209 from the bottom surface 100b to toward the metal film 104, as well as passing through the inside of the ring of the ring-like insulating film 101, is formed by means of the RIE method on a condition that selection ratios of materials constituting the semiconductor substrate 100, the polysilicon film 203 and the polysilicon film 209 are high with respect to the metal material constituting the metal film 104. It is to be noted that, although materials for the insulating films 202, 208 are different from the materials constituting the semiconductor substrate 100 and the polysilicon films 203, 209, since the insulating films 202, 208 have film thicknesses not larger than 20 nm, the insulating films 202, 208 can be etched simultaneously with the semiconductor substrate 100 and the polysilicon films 203, 209 even in the case of performing etching on such a condition as above. Further, similar to the first embodiment, it is preferable to form the opening 10 such that part of the semiconductor substrate 100 is located between the opening 10 and the insulating film 101, and specifically, it is preferable to form the opening 10 so as to be separated from the inner wall of the ring-like insulating film 101 by not shorter than 2 μm (distance D shown in FIG. 17 (c)).

Next, additional RIE is performed for adjusting variations in the film thickness of the semiconductor substrate 100. Similar to the first embodiment, it is difficult that etching proceeds in such a direction as to etch the metal film 104, and it proceeds in a lateral direction to etch the polysilicon film 209. Therefore, as shown in the sectional view of FIG. 18 (a), a side notch 211 may be generated in a portion of the polysilicon film 209 on the inner wall of the opening 10.

Figure 19:
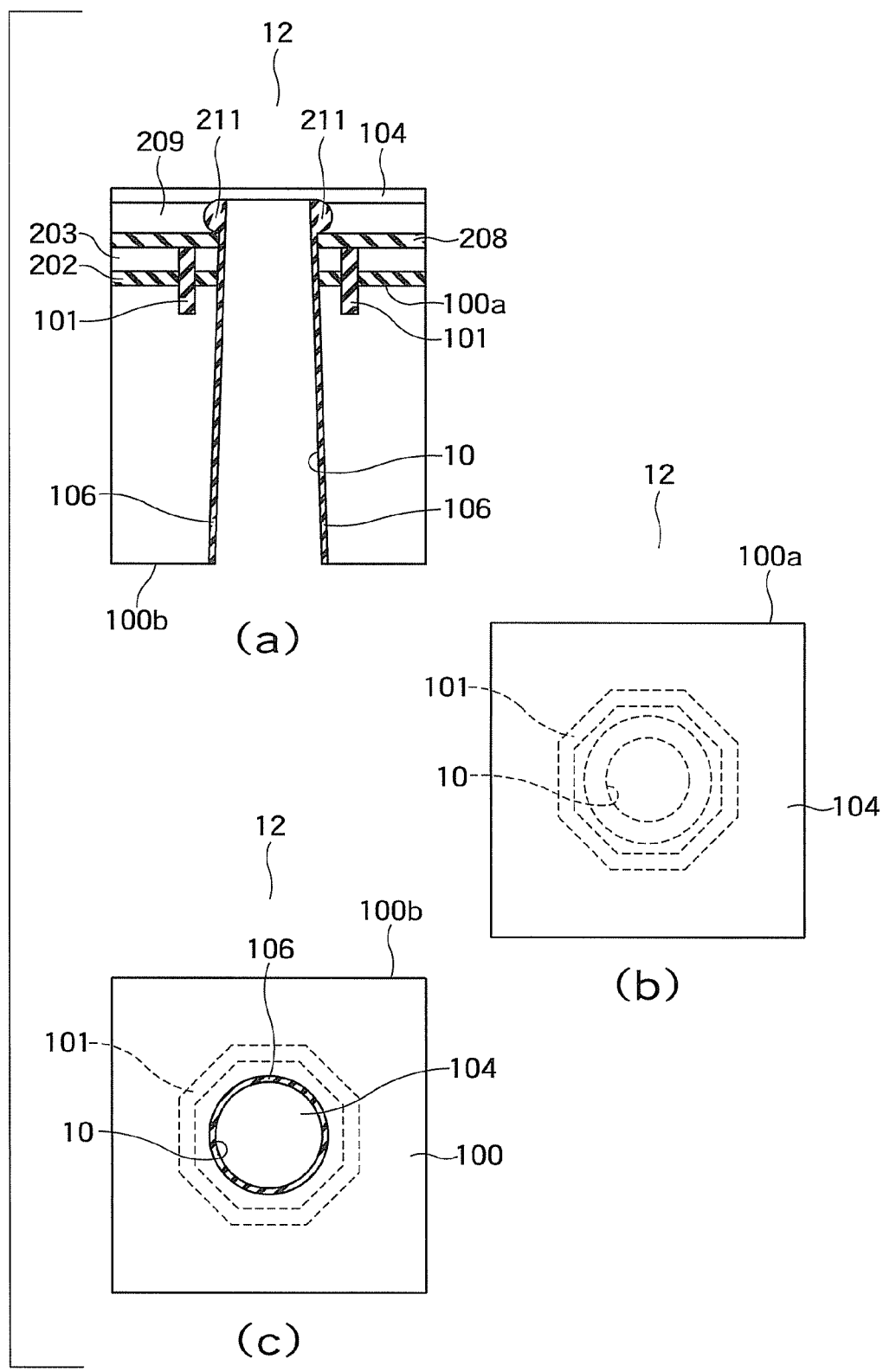

Then, as shown in the sectional view of FIG. 19 (a) and the bottom views of FIG. 19 (c), in the same manner as the first embodiment, the insulating film 106 is formed so as to cover the inner wall of the opening 10. As described above, the insulating film 106 preferably has such a film thickness as not to fill the opening 10.

Further, in the same manner as the first present embodiment, the metal film 107 is embedded in the opening 10, and the metal film 108 and the bump 109 are formed on the metal film 107, to form the TSV 11, but detailed descriptions thereof will be omitted since being similar to the first embodiment.

Figure 20:
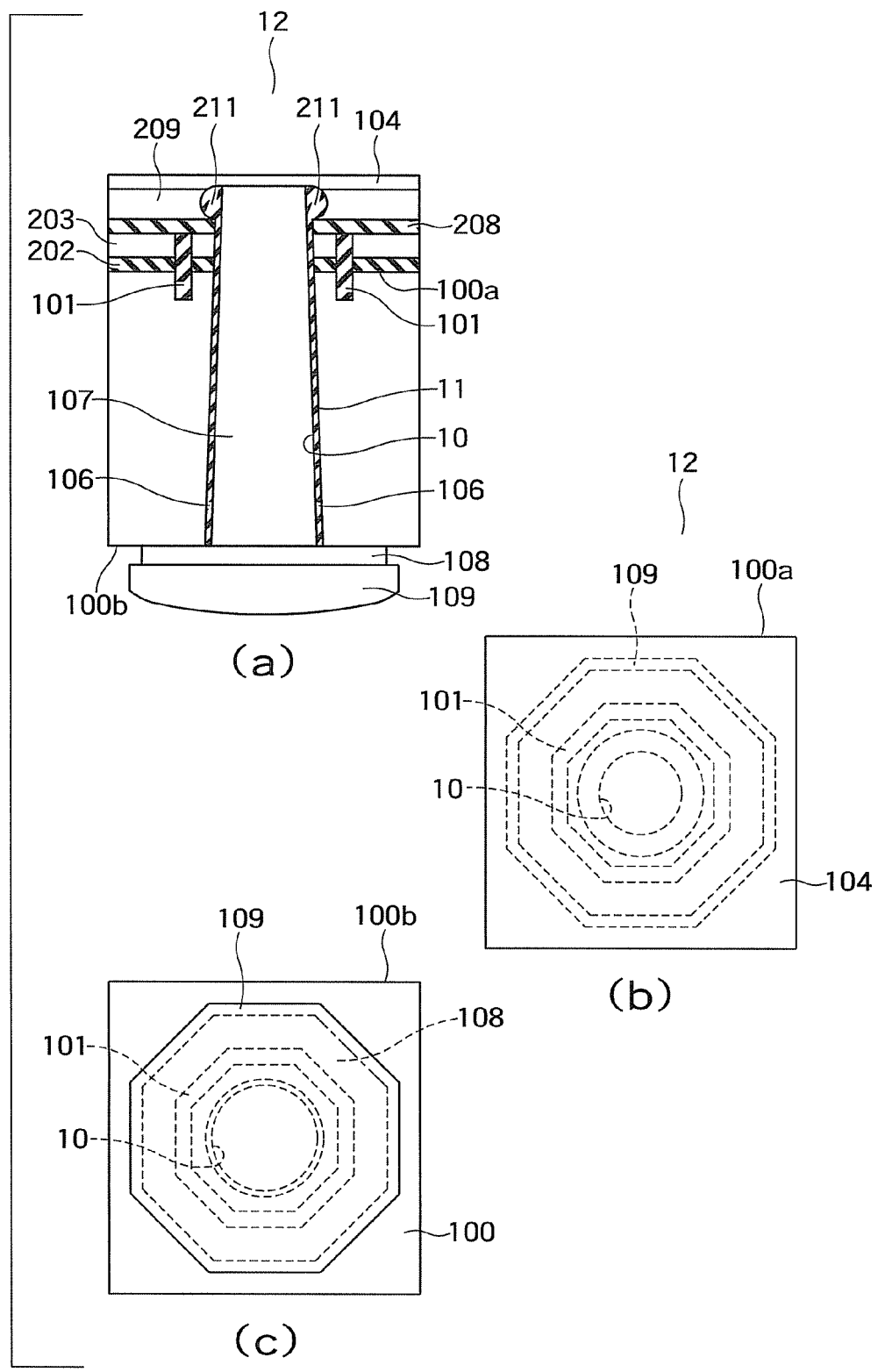
FIG. 20 is a view of the semiconductor device according to the second embodiment.

Next, the semiconductor device 12 according to the present embodiment will be described using FIG. 20. Specifically, FIG. 20 (a) is a sectional view of the semiconductor device 12, FIG. 20 (b) is a top view seen from the above of the top surface 100a, and FIG. 20 (c) is a bottom view seen from the above of the bottom surface 100b. As shown in FIG. 20, the semiconductor device 12 of the present embodiment has the semiconductor substrate 100, the insulating film 101 formed on the top surface 100a of the semiconductor substrate 100 and having a ring-like shape as seen from the above of the top surface 100a, the insulating film 208, the polysilicon film 209 and the metal film 104 sequentially formed above the top surface 100a and the insulating film 101, and the insulating film 202, the polysilicon film 203 and the TSV 11 sequentially formed between the top surface 100a and the insulating film 208. This TSV 11 has a plurality of openings 10 that pass through the semiconductor substrate 100, the insulating film 202, polysilicon film 203, the insulating film 208 and the polysilicon film 209 from the bottom surface 100b, as well as passing through the inside of the ring of the ring-like insulating film 101, to reach the surface of the metal film 104, the insulating film 106 formed so as to cover the inner wall of the opening 10, the metal film 107 embedded in the opening, the metal film 108 formed on the metal film 107, and the bump 109. It is to be noted a detailed description of the TSV 11 will be omitted since being similar to the first embodiment.

According to the present embodiment, similar to the first embodiment, it is possible to set a place where the side notch 211 is generated not to the portion of the semiconductor substrate 100 on the inner wall of the opening 10, but to the portion of the polysilicon film 209 on the inner wall of the opening 10. Hence, since the side notch 211 is not generated in the portion of the semiconductor substrate 100 on the inner wall of the opening 10, the insulating film 106 can be formed so as to cover the portion of the semiconductor substrate 100 on the inner wall of the opening 10, so as to avoid short-circuiting of the metal film 107 and the semiconductor substrate 100. This can improve the yield of the semiconductor device 12. Further, similar to the first embodiment, the present embodiment can be performed without significantly changing the semiconductor device manufacturing process which has hitherto been used.

Third Embodiment

A third embodiment is different from the first and second embodiments in being applied to a structure where a wiring layer 303 is formed on the top surface 100a of the semiconductor substrate 100. That is, the present embodiment is also applicable to such a structure.

Hereinafter, a method for manufacturing the semiconductor device 12 according to the present embodiment will be described using FIGS. 21A to 21F. FIGS. 21A to 21F are sectional views in respective process steps of the manufacturing method of the present embodiment. Herein, a description of a portion in common with the first and second embodiments will be omitted. Further, similar to the first and second embodiments, although an example applied to the BSV process will be described here, the present invention is not restricted to this, and is applicable to a variety of semiconductor elements such as a nonvolatile semiconductor storage device, a semiconductor device having a semiconductor storage element, and a variety of processes.

First, the groove 13 is formed on the top surface 100a in the same manner as the first embodiment. This groove 13 has a ring-like shape as seen from the above of the top surface 100a. Further, the insulating film 101 made up of silicon oxide or the like is formed so as to fill this groove 13. Then, on the top surface 100a and the insulating film 101, the insulating film 102 made up of a silicon oxide film or the like and having a film thickness of not larger than 20 nm, for example, and a metal film having a film thickness of 20 nm to 30 nm, for example, are sequentially laminated. Next, this metal film is processed so as to have a desired shape by means of a lithography method and the RIE method or the like, thus forming a plurality of electrode films 305 on the insulating film 102. In such a manner, a structure shown in FIG. 21A can be obtained.

Further, in order to cover the insulating film 102 and the electrode film 305, an insulating film 301 made up of a silicon oxide film, a silicon nitride film or the like is formed. The insulating film 301 preferably has a thinner film thickness than the semiconductor substrate 100, and its film thickness is 200 nm to 250 nm, for example. Then, contacts 40 electrically connected to each electrode film 305 are formed in an insulating film 301. Specifically, an opening that reaches each electrode film 305 is formed in the insulating film 301, and a metal film 302 or the like is embedded in each opening, to form the contacts 40. In such a manner, a structure shown in FIG. 21B can be obtained.

Next, the wiring layer 303 is formed on the insulating film 301 and the contacts 40. This wiring layer 303 may be formed by forming a groove having a desired shape in the insulating film 301 and embedding a metal layer made up of a copper film, a tungsten film or the like into the groove, or by laminating a metal layer on the insulating film 301 and processing it into a desired shape by means of the RIE method. Further, an insulating film 307 made up of a silicon oxide film, a silicon nitride film or the like is laminated on the wiring layer 303 and the insulating film 301. In such a manner, a structure shown in FIG. 21C can be obtained. It is to be noted that a film, an element or the like may be formed on the insulating film 301 or the insulating film 307.

Figure 21A:
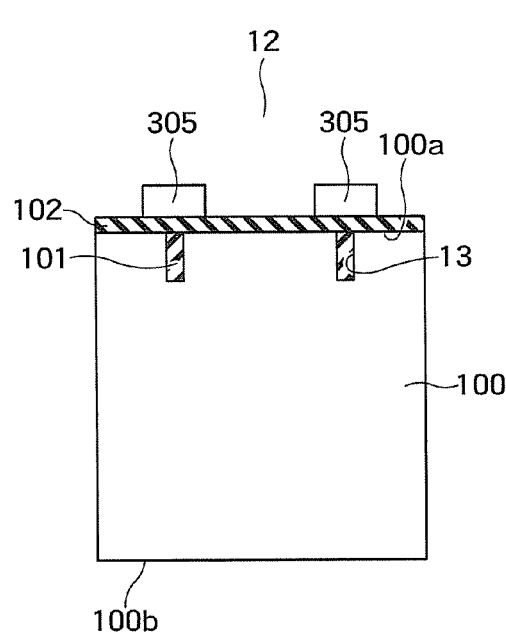
Figure 21B:
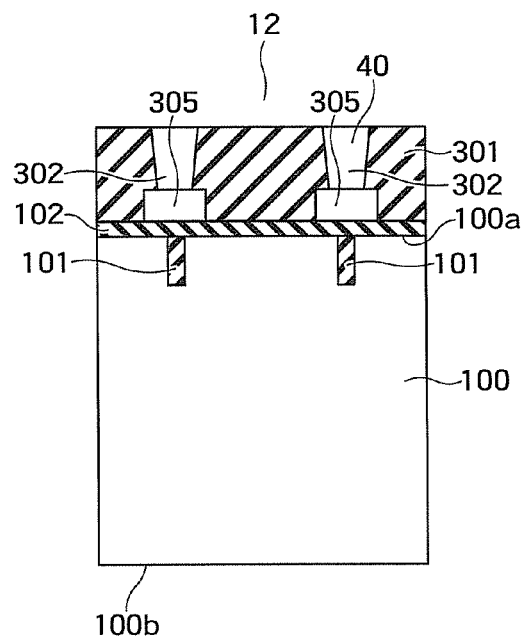
Figure 21C:
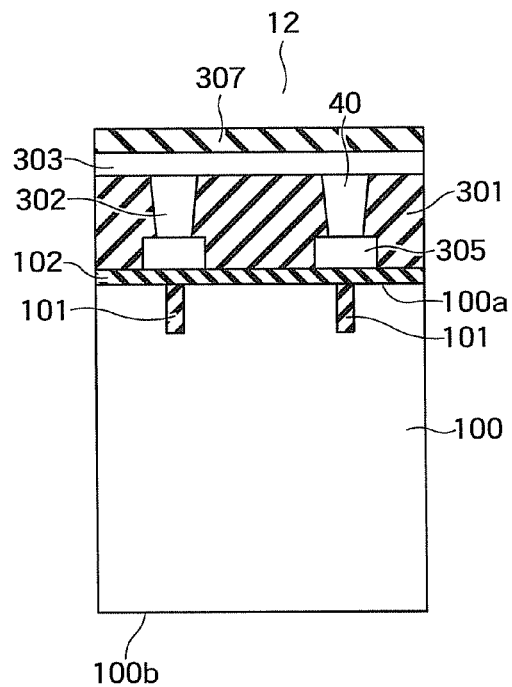
Figure 21D:
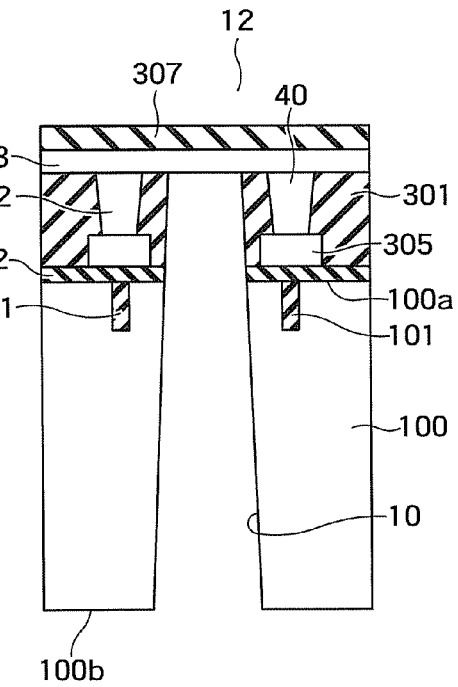

Then, as shown in FIG. 21D, in the same manner as the first embodiment, the opening 10 that passes through the semiconductor substrate 100 and the insulating films 102, 301 from the bottom surface 100b, as well as passing between two electrode films 305 adjacent to the inner ring of the ring-like insulating film 101, is formed by means of the RIE method on a condition that a selection ratio of a material constituting the semiconductor substrate 100 is high with respect to a metal material constituting the wiring layer 303. In addition, although a material for the insulating films 102, 301 is different from the material constituting the semiconductor substrate 100, since the insulating films 102, 301 are very thin as compared with the semiconductor substrate 100, even when the etching is performed on such a condition as above, the insulating films 102, 301 can be etched simultaneously with the semiconductor substrate 100. Further, similar to the first embodiment, it is preferable to form the opening 10 such that part of the semiconductor substrate 100 is located between the opening 10 and the insulating film 101, and specifically, it is preferable to form the opening 10 so as to be separated from the inner wall of the ring-like insulating film 101 by not shorter than 2 µm.

Next, additional RIE is performed for adjusting variations in the film thickness of the semiconductor substrate 100. Similar to the first embodiment, it is difficult that etching proceeds in such a direction as to etch the wiring layer 303, and it proceeds in a lateral direction to etch the insulating film 301. Therefore, as shown in the sectional view of FIG. 21E, a side notch 311 may be generated in a portion of the insulating film 301 on the inner wall of the opening 10. It is to be noted that the electrode film 305 and the contacts 40 may be exposed due to the side notch 311.

Then, as shown in FIG. 21F, in the same manner as the first embodiment, the insulating film 106 is formed so as to cover the inner wall of the opening 10. As described above, the insulating film 106 preferably has such a film thickness as not to fill the opening 10. At this time, the side notch 311 may not be sufficiently filled with the insulating film 106, and the electrode film 305 and the contacts 40 may be exposed in the side notch 311.

Further, in the same manner as the first present embodiment, the metal film 107 is embedded in the opening 10, and the metal film 108 and the bump 109 are formed on the metal film 107, to form the TSV 11, but detailed descriptions thereof will be omitted since being similar to the first embodiment. It is to be noted that, even when the electrode film 305 and the contacts 40 are exposed and come into direct contact with the metal film 107 in the side notch 311, the metal film 107, the electrode film 305 and the contacts 40 are just electrically connected, and hence this does not matter in terms of the function of the TSV 11.

According to the present embodiment, similar to the first and second embodiments, it is possible to set a place where the side notch 311 is generated not to the portion of the semiconductor substrate 100 on the inner wall of the opening 10, but to the portion of the insulating film 301 on the inner wall of the opening 10. Hence, since the side notch 311 is not generated in the portion of the semiconductor substrate 100 on the inner wall of the opening 10, the insulating film 106 can be formed so as to cover the portion of the semiconductor substrate 100 on the inner wall of the opening 10, so as to avoid short-circuiting of the metal film 107 and the semiconductor substrate 100. This can improve the yield of the semiconductor device 12. Further, similar to the first and second embodiments, the present embodiment can be performed without significantly changing the semiconductor device manufacturing process which has hitherto been used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method for manufacturing a semiconductor device, comprising:

forming, on a first surface of a semiconductor substrate containing silicon, a ring-like insulating film having a ring-like shape as seen from the above of the first surface;

sequentially laminating a first insulating film, a first silicon film and a first metal film on the first surface and the ring-like insulating film;

forming an opening which passes through the semiconductor substrate, the first insulating film and the first silicon film from a second surface of the semiconductor substrate located on the opposite side to the first surface by use of the first metal film as a stopper, as well as passing through the inside of the ring of the ring-like insulating film, to reach the surface of the first metal film;

forming a second insulating film so as to cover an inner wall of the opening; and embedding a second metal film into the opening, to form a through electrode connected with the first metal film.

2. The method for manufacturing a semiconductor device according to claim 1, wherein the first insulating film has a film thickness of not larger than 20 nm.

3. The method for manufacturing a semiconductor device according to claim 1, wherein the opening is formed such that part of the semiconductor substrate is located between the opening and the ring-like insulating film.

4. The method for manufacturing a semiconductor device according to claim 1, wherein the opening is formed by etching on a condition that selection ratios of the semiconductor substrate and the first silicon film are high with respect to the first metal film.

5. The method for manufacturing a semiconductor device according to claim 1, wherein the opening is formed by simultaneously etching the semiconductor substrate, the first insulating film and the first silicon film.

6. The method for manufacturing a semiconductor device according to claim 1, further comprising etching of the second surface for making the film thickness of the semiconductor substrate uniform in formation of the opening.

7. The method for manufacturing a semiconductor device according to claim 1, wherein the ring-like insulating film is formed by forming a groove having a ring-like shape as seen from the above of the first surface, and embedding a third insulating film into the groove.

8. The method for manufacturing a semiconductor device according to claim 1, further comprising:

sequentially laminating a fourth insulating film and a second silicon film on the first surface before forming the ring-like insulating film, wherein the opening is formed so as to pass through the fourth insulating film and the second silicon film.

* * * * *